(12) United States Patent
Nakano et al.

(10) Patent No.: US 11,784,208 B2
(45) Date of Patent: Oct. 10, 2023

(54) PHOTOELECTRIC CONVERSION DEVICE AND X-RAY IMAGING DEVICE

(71) Applicant: SHARP KABUSHIKI KAISHA, Sakai (JP)

(72) Inventors: Fumiki Nakano, Sakai (JP); Makoto Nakazawa, Sakai (JP); Hiroyuki Moriwaki, Sakai (JP); Rikiya Takita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/752,047

(22) Filed: May 24, 2022

(65) Prior Publication Data
US 2022/0392946 A1 Dec. 8, 2022

Related U.S. Application Data

(60) Provisional application No. 63/196,498, filed on Jun. 3, 2021.

(51) Int. Cl.
*H01L 27/146* (2006.01)
*H04N 5/32* (2023.01)
*G01T 1/20* (2006.01)

(52) U.S. Cl.
CPC ...... *H01L 27/14663* (2013.01); *G01T 1/2006* (2013.01); *H04N 5/32* (2013.01)

(58) Field of Classification Search
CPC ... H01L 27/14663; G01T 1/2006; H04N 5/32; H04N 25/76
See application file for complete search history.

(56) References Cited

U.S. PATENT DOCUMENTS

| | | |
|---|---|---|
| 2007/0278488 A1 | 12/2007 | Hirabayashi et al. |
| 2009/0166676 A1 | 7/2009 | Lee et al. |
| 2010/0294942 A1* | 11/2010 | Mochizuki ........ H01L 27/14663 250/366 |
| 2010/0301444 A1 | 12/2010 | Koike |
| 2015/0123119 A1 | 5/2015 | Sekine et al. |
| 2016/0293659 A1 | 10/2016 | Sekine et al. |
| 2021/0367078 A1 | 11/2021 | Yamazaki et al. |

FOREIGN PATENT DOCUMENTS

| | | |
|---|---|---|
| JP | 2007322761 A | 12/2007 |
| JP | 2009016432 A | 1/2009 |
| JP | 2009-164548 A | 7/2009 |
| JP | 2010258193 A | 11/2010 |
| JP | 2010278232 A | 12/2010 |
| JP | 2015090957 A | 5/2015 |
| WO | 2019/171198 A1 | 9/2019 |

* cited by examiner

*Primary Examiner* — Kiho Kim
(74) *Attorney, Agent, or Firm* — ScienBiziP, P.C.

(57) ABSTRACT

A photoelectric conversion device according to one embodiment includes a first transistor and a first photoelectric conversion element disposed on a first region, a second transistor disposed on a second region, an insulating layer that covers the first transistor, the first photoelectric conversion element, and the second transistor, and a first terminal that is disposed on the insulating layer, is electrically connected to one of the first transistor and the first photoelectric conversion element, and is connectable to an outside. The second transistor is a dummy transistor of the first transistor.

19 Claims, 21 Drawing Sheets

PHOTOELECTRIC CONVERSION DEVICE AND X-RAY IMAGING DEVICE

CROSS REFERENCE TO RELATED APPLICATION

The present application claims priority from U.S. Provisional Application No. 63/196,498, filed Jun. 3, 2021, the entire contents of which are hereby incorporated by reference into this application.

BACKGROUND

1. Field

The present disclosure relates to a photoelectric conversion device and an X-ray imaging device.

2. Description of the Related Art

For example, Japanese Unexamined Patent Publication No. 2009-164548 discloses a semiconductor device that includes a SiGe device disposed in an inner region, and a dummy pattern disposed in an intermediate annular region that lies between the inner region and an outer region. Japanese Unexamined Patent Publication No. 2009-164548 describes that, due to this structure, the micro loading effect that occurs during SiGe epitaxial growth is alleviated.

SUMMARY

However, when a photoelectric conversion device includes multiple pixels arranged into a matrix and when a dummy pattern is disposed outside the pixel region in a plan view, the area of the frame region surrounding the pixel region increases particularly, and thus the size of the photoelectric conversion device in a plan view can increase. Moreover, there may be limits to the outer size, and narrower frames may become desirable.

Thus, an object of one embodiment of the present disclosure is to provide a photoelectric conversion device and an X-ray imaging device with which the micro loading effect can be reduced while suppressing the size increase.

(1) A photoelectric conversion device according to an aspect of the present disclosure includes a first transistor disposed on a first region of a substrate; a first photoelectric conversion element that is disposed on the first region of the substrate and is electrically connected to the first transistor; a second transistor disposed on a second region of the substrate, an insulating layer that is disposed on the substrate and covers the first transistor, the first photoelectric conversion element, and the second transistor; and a first terminal that is disposed on the insulating layer, is electrically connected to one of the first transistor and the first photoelectric conversion element, and is connectable to an outside, wherein the second transistor is a dummy transistor of the first transistor (2) In the photoelectric conversion device described in (1) above, the first terminal is disposed on the insulating layer in the second region.

(3) In the photoelectric conversion device described in (1) or (2) above, the first terminal overlaps the second transistor in a plan view.

(4) In the photoelectric conversion device described in any one of (1) to (3) above, the first terminal is electrically connected to a gate of the first transistor, and a gate of the second transistor is electrically floating.

(5) In the photoelectric conversion device described in any one of (1) to (3) above, the first terminal is electrically connected to a source or a drain of the first transistor.

(6) In the photoelectric conversion device described in any one of (1) to (5) above, the second region surrounds the first region.

(7) The photoelectric conversion device described in any one of (1) to (6) further includes a third transistor that is disposed on a third region of the substrate, and a second photoelectric conversion element electrically connected to the third transistor, the third transistor is a dummy transistor of the first transistor, the second photoelectric conversion element is a dummy element of the first photoelectric conversion element, a gate of the third transistor is not electrically connected to the first terminal, and the third region surrounds the first region and is between the first region and the second region.

(8) In the photoelectric conversion device described in (7) above, the first region is an active region that generates charges according to incident light and outputs a voltage corresponding to the charges to outside, and the second region and the third region are dummy regions of the active region.

(9) In the photoelectric conversion device described in any one of (1) to (8) above, the insulating layer includes a first insulating layer disposed on the substrate, and a second insulating layer disposed on the first insulating layer, and the first terminal is disposed on the second insulating layer.

(10) The photoelectric conversion device described in any one of (1) to (9) above further includes an ESD (electrostatic discharge) element disposed on a third region of the substrate, and the third region is adjacent to the second region.

(11) In the photoelectric conversion device described in any one of (1) to (10) above, the first photoelectric conversion element includes an n-type semiconductor layer, a p-type semiconductor layer, and an i-type semiconductor layer disposed between the n-type semiconductor layer and the p-type semiconductor layer. It should be noted that the order in which semiconductor layers are stacked in the first photoelectric conversion element may be $n^+$-type layer/i-type layer/$p^+$-type layer or $p^+$-type layer/i-type layer/$n^+$-type layer, and is not particularly limited.

(12) In the photoelectric conversion device described in any one of (1) to (11) above, the first transistor is an oxide semiconductor TFT (thin film transistor) that includes an oxide semiconductor layer and a gate electrode disposed on the oxide semiconductor layer with a gate insulating film interposed therebetween.

(13) In the photoelectric conversion device described in any one of (1) to (12) above, the oxide semiconductor layer contains an In—Ga—Zn—O semiconductor.

(14) An X-ray imaging device according to one aspect of the present disclosure includes the photoelectric conversion device described in (1) above, and a scintillator that converts incident X-ray into scintillation light, the scintillator being disposed on the photoelectric conversion device.

(15) In the X-ray imaging device described in (14) above, the scintillation light is converted into charges in the first region. However, when the third transistor in the first region is a dummy transistor having the gate not electrically connected to the first terminal, signals generated from the second photoelectric conversion element is not output to outside.

(16) In the X-ray imaging device described in (14) or (15) above, the scintillation light obtained by the scintillator enters the second region but is not converted into charges since there is no photoelectrical conversion element.

DETAILED DESCRIPTION

Figure 4A:
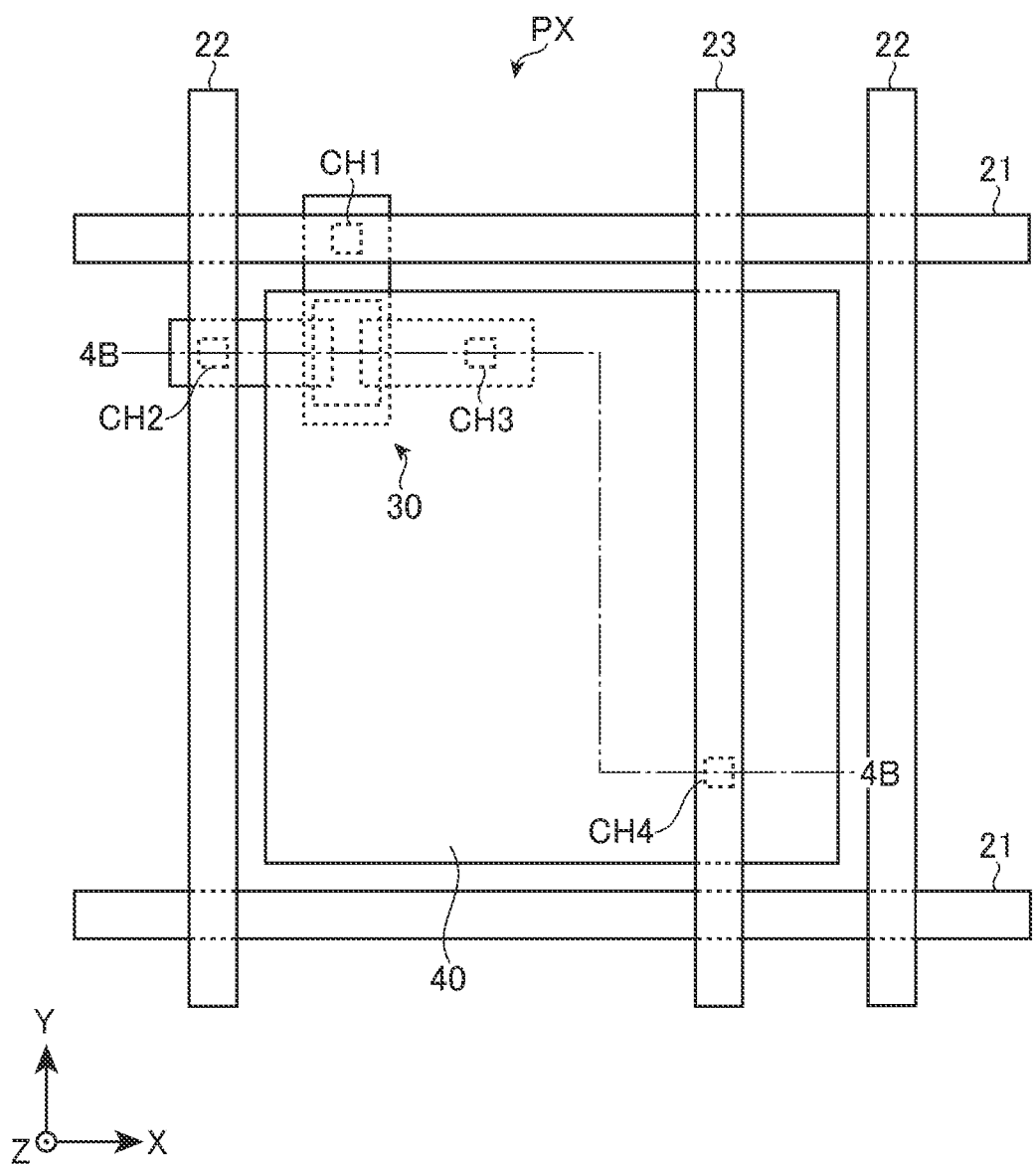
FIG. 4A is a plan view of a pixel in the photoelectric conversion device according to the first embodiment.
Figure 4B:
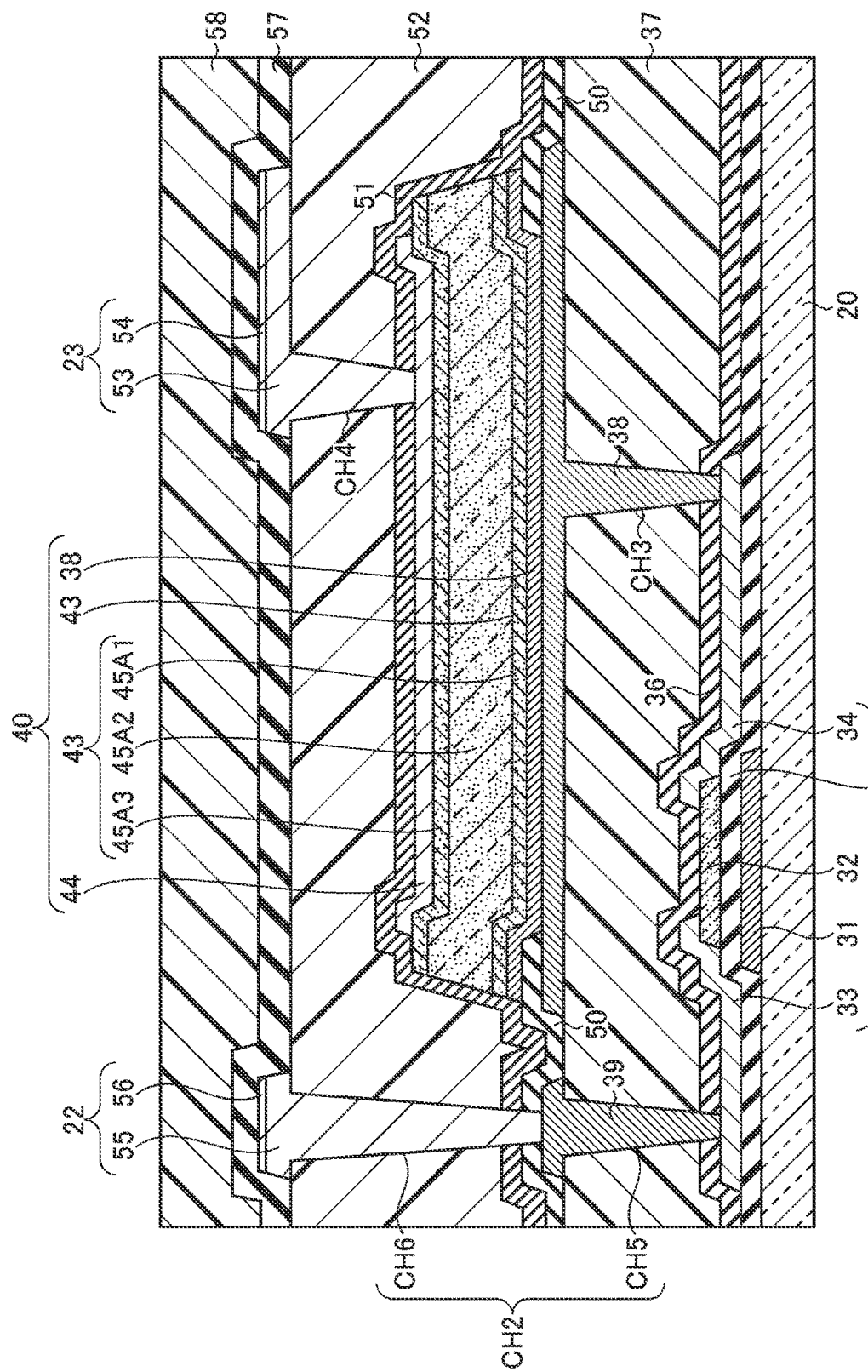
FIG. 4B is a cross-sectional view taken along line 4B-4B in FIG. 4A.

Exemplary embodiments of the present invention will now be described with reference to the drawings. In some of the drawings, the X axis, the Y axis, and the Z axis are indicated, and the directions of respective axes are directions illustrated in these drawings. Moreover, FIG. 4B is used as the reference for defining upward and downward directions, and the upper portion of the illustration in FIG. 4B is defined as the upside and the lower portion thereof is defined as the downside. However, these definitions of the directions are merely for the convenience of descriptions, and are not intended to limit the orientation of the photoelectric conversion device and the X-ray imaging device of the present invention during production or during use. Moreover, in the drawings, the same features are denoted by the same reference signs, and redundant descriptions therefor are omitted.

First Embodiment

Figure 1:
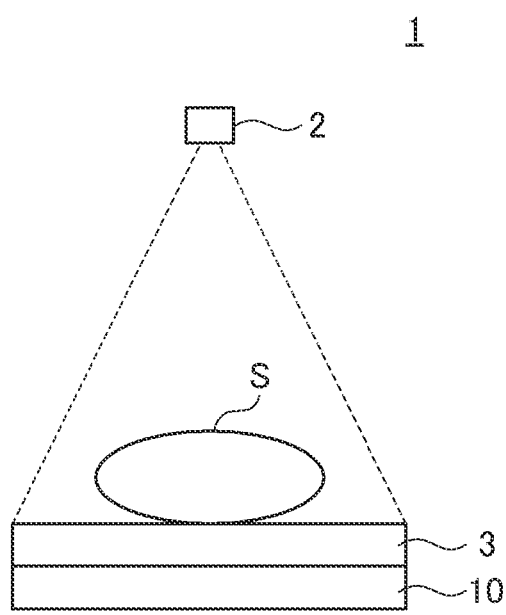
FIG. 1 is a schematic view illustrating a schematic structure of an X-ray imaging device according to a first embodiment.

First, a photoelectric conversion device and an X-ray imaging device according to a first embodiment are described. FIG. 1 is a schematic diagram illustrating a schematic structure of an X-ray imaging device 1 equipped with a photoelectric conversion device 10 according to this embodiment. The X-ray imaging device 1 images a subject S with X-ray. The X-ray imaging device 1 is used, for example, in an X-ray transmission examination device and an X-ray CT device. The X-ray imaging device 1 has an X-ray source 2, a scintillator 3, and the photoelectric conversion device 10.

The X-ray source 2 irradiates the subject S with X-ray. The X-ray incident on the subject S passes through the subject S and enters the scintillator 3 disposed on the photoelectric conversion device 10. The X-ray that has entered the scintillator 3 is converted to fluorescence (hereinafter referred to as scintillation light) and enters the photoelectric conversion device 10. The scintillation light that has entered the photoelectric conversion device 10 is converted into charges corresponding to the light amount by photoelectric conversion elements 40 disposed in the photoelectric conversion device 10 described below, and readout as electrical signals. Then the photoelectric conversion device 10 generates an X-ray image on the basis of the electrical signals.

Figure 2A:
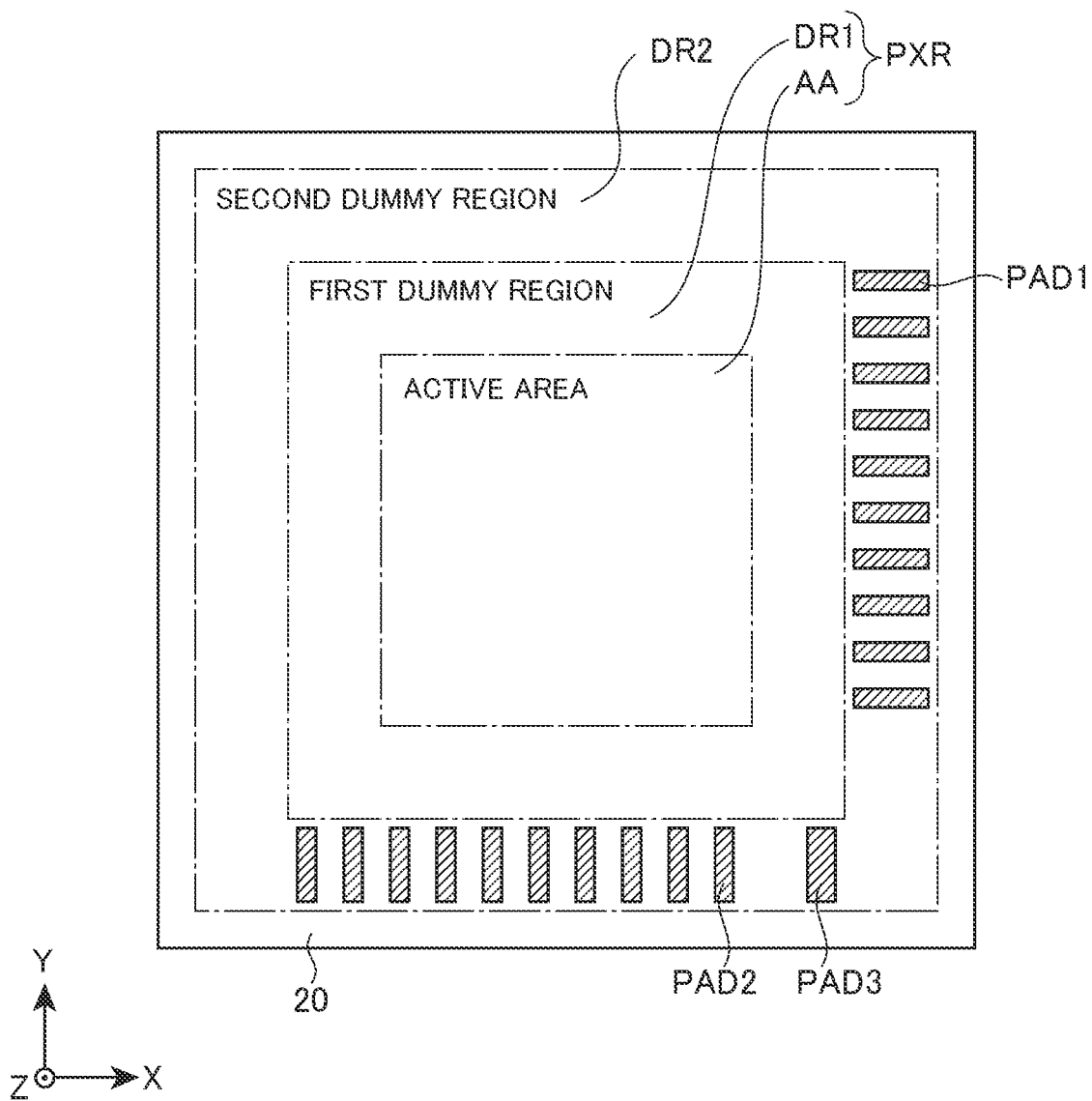
FIG. 2A is a plan view illustrating a schematic structure of a photoelectric conversion device according to a first embodiment.

FIG. 2A is a plan view illustrating a schematic structure of the photoelectric conversion device 10 according to this embodiment. As illustrated in the drawing, broadly speaking, the photoelectric conversion device 10 has a substrate 20 that includes a pixel region PXR (corresponding to a first region) and a second dummy region DR2 (corresponding to a second region). The photoelectric conversion device 10 is equipped with external connection terminals PAD1, PAD2, and PAD3 (corresponding to first terminals) disposed in the second dummy region DR2 to exchange signals with externals of the substrate 20. Note that when the external connection terminals PAD1, PAD2, and PAD3 are not differentiated, they are simply referred to as the external connection terminals PAD.

In this description, a region where elements that actually perform photoelectric conversion are formed is referred to as an active area, and a region where photoelectric conversion is not performed and where structures similar to the elements formed in the active area are formed is referred to as a dummy region. In other words, the active area is a region used to convert the aforementioned scintillation light into charges by the photoelectric conversion elements to obtain an X-ray image, and the dummy region is a region that has structures similar to the active area but these structures do not contribute to the operation for obtaining the X-ray image. In the description below, a first dummy region and a second dummy region are described as the dummy regions, and have the same definition.

The pixel region PXR has an active area AA and a first dummy region (corresponding to a third region) DR1. The active area AA has multiple pixels that include thin film transistors (TFTs) and photoelectric conversion elements. The incident scintillation light is converted into electrical signals by these pixels, and the electrical signals are output to outside through the external connection terminals PAD. The active area AA is set, for example, near the center portion of the substrate 20.

The first dummy region DR1 is equipped with multiple dummy pixels that include TFTs and photoelectric conversion elements. Unlike the pixels in the active area AA, these dummy pixels are equipped with photoelectric conversion elements but are not used to actually detect the X-ray. The first dummy region DR1 surrounds the active area AA in the XY plane in FIG. 2A. In other words, the dummy pixels in the first dummy region DR1 surround a set of pixels inside the active area AA.

The second dummy region DR2 is equipped with multiple dummy pixels that include TFTs but not photoelectric conversion elements. Unlike the pixels in the active area AA, these dummy pixels are also not used to actually detect the X-ray. The second dummy region DR2 surrounds the first dummy region DR1 in the XY plane in FIG. 2A. In other words, the dummy pixels in the second dummy region DR2 surround a set of pixels inside the first dummy region DR1.

In this description, pixels that are formed in the active area and actually perform photoelectric conversion are simply referred to as pixels, and pixels that do not perform photoelectric conversion, are formed in dummy regions, and have structures similar to the pixels formed in the active region are referred to as dummy pixels. In other words, pixels are a set of elements that converts the aforementioned scintillation light into charges by the photoelectric conversion elements to obtain an X-ray image, and dummy pixels are elements or a set of elements that do have structures similar to the pixels but do not contribute to obtaining the X-ray image.

In the second dummy region DR2, the external connection terminals PAD are disposed above the substrate 20 along the Z axis. The external connection terminals PAD are for establishing electrical connection, such as by wire bonding, between the photoelectric conversion device 10 and a control device for controlling the photoelectric conversion device 10. In FIG. 2A, for example, the external connection terminals PAD1 arranged along the Y direction receive signals for selecting pixels in one of the rows in the active area AA from the control circuit. Furthermore, the external connection terminals PAD2 arranged along the X direction output image signals transferred from the pixels of each of the rows in the active area AA to the control circuit. The external connection terminal PAD3 receives bias voltage to be applied to the pixels from the control circuit.

Figure 2B:
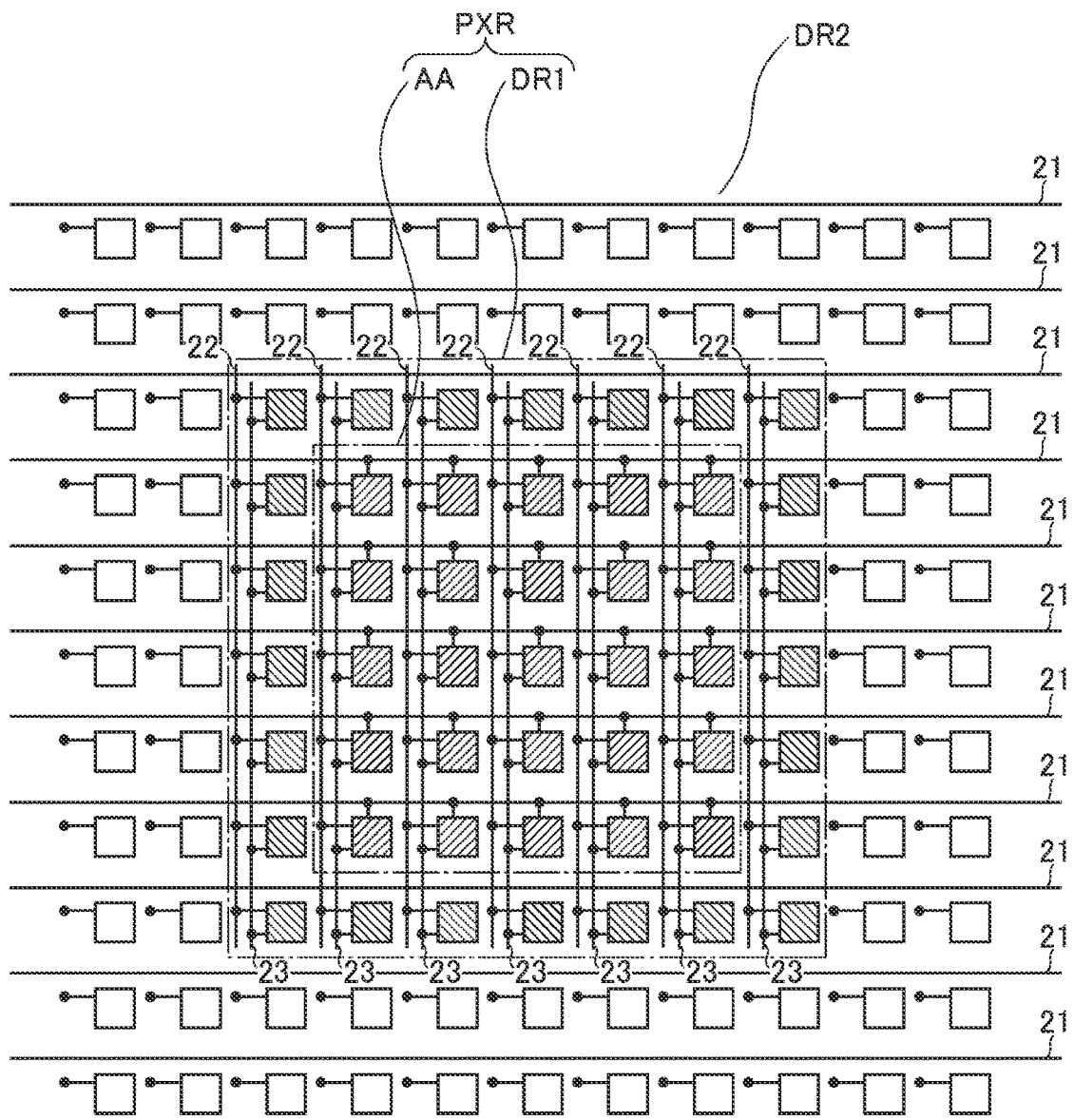
FIG. 2B is a plan view illustrating schematic structures of an active area, a first dummy region, and a second dummy region of the photoelectric conversion device according to the first embodiment.
Figure 2B:
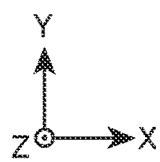

Next, referring to FIG. 2B, examples of the arrangement of the pixels and dummy pixels in the active area AA, the first dummy region DR1, and the second dummy region DR2 described above are described. FIG. 2B is a schematic view illustrating more detailed structures of the active area AA, the first dummy region DR1, and the second dummy region DR2, and indicates the XY plane as in FIG. 2A.

As illustrated in the drawing, in the example illustrated in FIG. 2B, the photoelectric conversion device 10 of this embodiment is equipped with a set of (11×11) pixels and dummy pixels arranged into a matrix, for example. Among these, a set of (7×7) pixels PX and dummy pixels DPX1 arranged into a matrix in the center portion constitutes a pixel region PXR. Furthermore, a set of (5×5) pixels PX arranged into a matrix at the center portion of the pixel region PXR constitutes the active area AA, and a set of dummy pixels DPX1 arranged around the active area AA in the pixel region PXR constitutes the first dummy region DR1. Furthermore, a set of dummy pixels DPX2 arranged around the pixel region PXR constitutes the second dummy region DR2. The numbers of the pixels PX and dummy pixels DPX1 and DPX2 contained in the active area AA, the first dummy region DR1, and the second dummy region DR2 are merely exemplary, and are not limited to the case illustrated in FIG. 2B. In this embodiment, the pixels PX refer to structures that contribute to an image formed by X-ray imaging, and dummy pixels DPX1 and DPX2 refer to structures that do not contribute to the obtained image irrespective of the circuit structures thereof.

Furthermore, multiple gate wires 21 extending in the X direction, and multiple data wires 22 and bias wires 23 extending in the Y direction are disposed on the substrate 20. As illustrated in FIG. 2B, the gate wires 21 include wires 21 that pass through three regions, i.e., the active area AA, the first dummy region DR1, and the second dummy region DR2, the wires 21 that pass through the first dummy region DR1 and the second dummy region DR2 but not the active area AA, and the wires 21 that pass through the second dummy region DR2 but not the active area AA or the first dummy region DR1. Of these, the wires 21 that pass through three regions AA, DR1, and DR2 are each connected to the pixels PX located on the same row, and are not connected to the dummy pixels DPX1 or DPX2. Moreover, each of the wires 21 that pass through two regions DR1 and DR2 but not the region AA is not connected to the dummy pixels DPX1 and DPX2 located on the same row. Furthermore, the wires 21 that pass through the region DR2 but not the regions AA and DR2 are not connected to any of the pixels PX or the dummy pixels DPX1 or DPX2. In other words, the gate wires 21 connected to the pixels PX substantially function as wires for selecting the pixels PX of one of the rows whereas other wires not connected to the pixels PX are dummy wires. Alternatively, in the structure illustrated in FIG. 2B, the gate wires 21 may be connected to the dummy pixels DPX1 but not the dummy pixels DPX2, or may be connected to both the dummy pixels DPX1 and dummy pixels DPX2.

The data wires 22 are disposed in the pixel region PXR. The data wires 22 include wires 22 that pass through two regions, namely, the active area AA and the first dummy region DR1, and wires 22 that pass through the first dummy region DR1 but not the active area AA. Of these, the wires 22 that pass through two regions AA and DR1 are each connected to the pixels PX and dummy pixels DPX1 located on the same column. Moreover, the wires 22 that pass through the region DR1 but not the region AA are connected to the dummy pixels DPX1 located on the same column. In addition, the data wires 22 connected to the pixels PX substantially function as wires for transferring voltage obtained from the pixels PX whereas other wires 22 not connected to the pixels PX are dummy wires. Furthermore, the data wires 22 that are not connected to these pixels PX may be commonly connected in one of the regions.

The bias wires 23 are disposed in the pixel region PXR. The bias wires 23 include wires 23 that pass through two regions, namely, the active area AA and the first dummy region DR1, and wires 23 that pass through the first dummy region DR1 but not the active area AA. Of these, the wires 23 that pass through two regions AA and DR1 are each connected to the pixels PX and dummy pixels DPX1 located on the same column. Moreover, the wires 23 that pass through the region DR1 but not the region AA are connected to the dummy pixels DPX1 located on the same column. In addition, the bias wires 23 connected to the pixels PX substantially function as wires for transferring voltage necessary to actuate the pixels PX whereas other wires 23 not connected to the pixels PX are dummy wires. Furthermore, these bias wires 23 may be commonly connected in one of the regions.

As discussed above, in this description, pixels that are formed in the active area and actually serve as current paths to the data wires 22 are simply referred to as pixels, and pixels that have structures that do not form current paths to the data wires 22, are formed in dummy regions, and have structures similar to the pixels are referred to as dummy pixels. The same applies to the gate wires 21, the data wires 22, and the bias wires 23. A wire 21 connected to a particular pixel serves as a gate wire for selecting this particular pixel. However, wires 21 not connected to the pixels are dummy gate wires that are not actually used to select the pixels. The dummy gate wires are also formed in the same direction as and at substantially the same pitch as the gate wires. In addition, a wire 22 connected to a particular pixel serves as a data wire for transferring a signal from this particular pixel. However, wires 22 not connected to the pixels are dummy data wires that are not actually used to transfer signals from the pixels to the control circuit described below. The dummy data wires are also formed in the same direction as and at substantially the same pitch as the data wires. In addition, a wire 23 connected to a particular pixel serves as a bias wire for applying voltage to this particular pixel. However, wires 23 not connected to the pixels are dummy bias wires that are not actually used to apply biases to the pixels. The dummy bias wires are also formed in the same direction as and at substantially the same pitch as the bias wires.

In the structure described above, the control circuit wire-bonded, for example, through the external connection terminal PAD3 applies predetermined voltage (bias voltage) to the bias wires 23 during measurement. As described above, the X-ray emitted from the X-ray source 2 passes through the subject S and enters the scintillator 3. The X-ray that has entered the scintillator 3 is converted to scintillation light and enters the photoelectric conversion device 10. The scintillation light that has entered the photoelectric conversion device 10 is converted into charges corresponding to the light amount by photoelectric conversion elements of the pixels PX disposed in active area AA. The scintillation light enters the second dummy region DR2 (dummy pixels DPX2) but is not output as signals. The signals (image signals) corresponding to the charges converted by the photoelectric conversion elements of the pixels PX are output to the data wires 22 via TFTs that are turned ON according to the gate voltage applied to the gate wires 21 from the control circuit wire-bonded through the external connection terminals PAD1. The signals output to the data wires 22 are transferred to the control circuit wire-bonded thereto through the external connection terminals PAD2, and an X-ray image is generated in the control circuit.

Figure 3A:
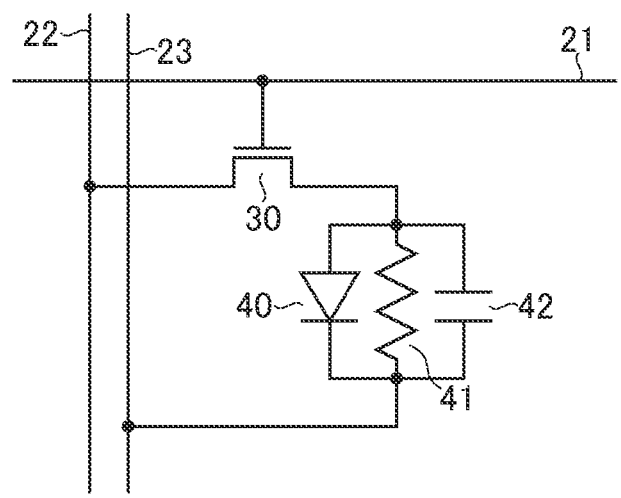
FIG. 3A is a circuit diagram of a pixel in the photoelectric conversion device according to the first embodiment.
Figure 3B:
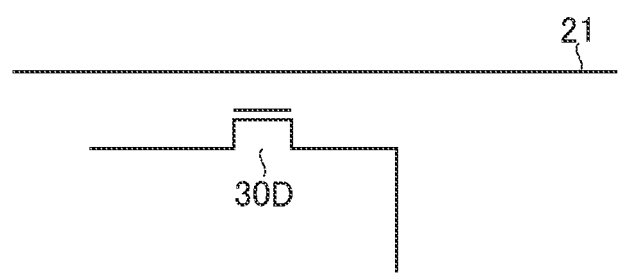
FIG. 3B is a circuit diagram of a dummy pixel of the photoelectric conversion device according to the first embodiment.

Next, the structures of the pixels PX, the dummy pixels DPX1, and the dummy pixels DPX2 are described with reference to FIGS. 3A and 3B. FIG. 3A is an equivalent circuit diagram of a pixel PX and a dummy pixel DPX1, and FIG. 3B is an equivalent circuit of a dummy pixel DPX2.

First, the pixel PX is described. As illustrated in FIG. 3A, the pixel PX is equipped with a TFT 30 (corresponding to a first transistor), a photoelectric conversion element 40 (corresponding to a first photoelectric conversion element), a resistive element 41, and a capacitor element 42. The TFT 30 has a gate connected to a gate wire 21 and a source connected to a data wire 22. The photoelectric conversion element 40, the resistive element 41, and the capacitor element 42 are connected in parallel. In other words, the cathode of the photoelectric conversion element 40, one end of the resistive element 41, and one electrode of the capacitor element 42 are commonly connected, and are further connected to the drain of the TFT 30. The anode of the photoelectric conversion element 40, the other end of the resistive element 41, and the other electrode of the capacitor element 42 are commonly connected, and are further connected to a bias wire 23. According to this structure, the TFT 30 functions as a switching element. The incident X-ray is converted to voltage by the photoelectric conversion element 40, and the voltage is transferred to the data line 22 via the TFT 30.

Next, the dummy pixel DPX1 is described. The dummy pixel DPX1 has substantially the same structure as the pixel PX described with reference to FIG. 3A. In other words, the dummy pixel DPX1 is equipped with a TFT 30D (corresponding to a third transistor), a photoelectric conversion element 40 (corresponding to a second photoelectric conversion element), a resistive element 41, and a capacitor element 42. In the TFT 30D, the source is connected to the data wire 22, but the gate is not connected to the gate wire 21 and is in an electrically floating state, for example. The TFT 30D of the dummy pixel DPX1 is a dummy transistor of the TFT 30 of the pixel PX. In other words, the TFT 30 of the dummy pixel DPX1 has substantially the same structure as the TFT 30 of the pixel PX, but, unlike the TFT 30 of the pixel PX, is not used to transfer signals to the data wire 22. The photoelectric conversion element 40, the resistive element 41, and the capacitor element 42 are connected in parallel. In other words, the cathode of the photoelectric conversion element 40, one end of the resistive element 41, and one electrode of the capacitor element 42 are commonly connected, and are further connected to the drain of the TFT 30D. The anode of the photoelectric conversion element 40, the other end of the resistive element 41, and the other electrode of the capacitor element 42 are commonly connected, and are further connected to a bias wire 23. These photoelectric conversion element 40, resistive element 41, and capacitor element 42 are also dummy elements of the photoelectric conversion element 40, the resistive element 41, and the capacitor element 42 of the pixel PX. In particular, the photoelectric conversion element 30 of the dummy pixel DPX1 has substantially the same structure as the photoelectric conversion element 30 of the pixel PX, but is not used in photoelectric conversion for obtaining an X-ray image. In this structure, among the data wires 22 connected to the TFTs 30D, those that are not connected to the TFTs 30 are dummy wires.

Next, the dummy pixel DPX2 is described. As illustrated in FIG. 3B, the dummy pixel DPX2 is equipped with a TFT 30D (corresponding to a second transistor) but, unlike the pixel PX and the dummy pixel DPX1, is not equipped with a photoelectric conversion element, a resistive element, or a capacitor element. The source of the TFT 30D is not connected to the data wire 22 and is in a floating state, the gate is not connected to the gate wire 21 and is in a floating state, and the drain is also in a floating state. The gate of the TFT 30D may be fixed to GND, for example. The TFT 30D of the dummy pixel DPX2 is a dummy transistor of the TFT 30 of the pixel PX. In other words, the TFT 30D of the dummy pixel DPX2 has substantially the same structure as the TFT 30 of the pixel PX, but, unlike the TFT 30 of the pixel PX, is not used to transfer signals to the data wire 22.

Next, the detailed structures of the pixels PX and the dummy pixels DPX1 and DPX2 described above are described. First, the structure of the pixel PX is described with reference to FIG. 4A. FIG. 4A is a partial top view illustrating structures near the photoelectric conversion element 40 of one pixel PX.

As illustrated in FIG. 4A, the TFT 30 and the photoelectric conversion element 40 of the present embodiment are disposed in a region surrounded by the gate wires 21 and the data wires 22 in a top view (XY plane). Furthermore, a bias wire 23 is disposed on the substrate 20. The gate wires 21, the data wires 22, and the bias wire 23 are respectively connected to the external connection terminals PAD1, PAD2, and PAD3 disposed above the second dummy region DR2.

The TFT 30 of this embodiment is disposed near the region where a gate wire 21 and a data wire 22 intersect, for example. The photoelectric conversion element 40 having a rectangular shape is disposed above the TFT 30 so as to overlap the TFT 30 in the Z direction. The gate electrode of the TFT 30 is extended to directly below the corresponding gate wire 21, and is connected to the gate wire 21 via a contact hole CH1. The source electrode of the TFT 30 is extended to directly below the corresponding data wire 22, and is connected to the data wire 22 via a contact hole CH2. The drain electrode of the TFT 30 is connected to the photoelectric conversion element 40 via a contact hole CH3. Furthermore, the bias wire 23 is disposed above the photoelectric conversion element 40, and is connected to the photoelectric conversion element 40 via a contact hole CH4. Note that, in FIG. 4A, illustration of the resistive element 41 and the capacitor element 42 are omitted for the sake of simplicity.

FIG. 4B is a cross-sectional view taken along line 4B-4B in FIG. 4A. As illustrated in the drawing, the TFT 30 of this embodiment includes a gate electrode 31, a semiconductor layer 32, a source electrode 33, and a drain electrode 34. The gate electrode 31, the source electrode 33, and the drain electrode 34 are each a metal film used in forming the TFT 30.

The gate electrode 31 is disposed on the substrate 20. The substrate 20 is formed of a material such as glass. The gate electrode 31 is electrically connected to the gate wire 21 not illustrated in the drawing. For example, the gate electrode 31 and the gate wire 21 are formed at the same level by using the same material in the same step.

The gate electrode 31 and the gate wire 21 each have a multilayer structure including a tantalum nitride (TaN)- containing metal film as a lower layer and a tungsten (W)-containing metal film as an upper layer, for example. Alternatively, the gate electrode 31 and the gate wire 21 may each have a multilayer structure including a titanium (Ti)-containing metal film as a lower layer and a copper (Cu)-containing metal film as an upper layer, for example. Alternatively, the gate electrode 31 and the gate wire 21 may each have a multilayer structure including an aluminum (Al)-containing metal film as a lower layer, and a molybdenum nitride (MoN)-containing metal film as an upper layer, for example. However, in this embodiment, the materials for the gate electrode 31 and the gate wire 21 are not limited to these.

Furthermore, a gate insulating film 35 covering the gate electrode 31 is disposed on the substrate 20. The gate insulating film 35 is constituted by an inorganic insulating film that contains, for example, silicon oxide ($SiO_x$), silicon nitride ($SiN_x$), silicon oxynitride ($SiO_xN_y$) (x>y), or silicon oxynitride ($SiN_xO_y$) (x>y). The gate insulating film 35 of this embodiment has a multilayer structure that includes a silicon nitride ($SiN_x$)-containing inorganic insulating film as a lower layer and a silicon oxide ($SiO_x$)-containing inorganic insulating film as an upper layer. However, in this embodiment, the materials for the gate insulating film 35 are not limited to these.

The semiconductor layer 32 is disposed on the gate insulating film 35 so that the semiconductor layer 32 overlaps the gate electrode 31 with the gate insulating film 35 therebetween. For example, the semiconductor layer 32 is formed of an oxide semiconductor. Examples of the oxide semiconductor include $InGaO_3(ZnO)_5$, zinc magnesium oxide ($Mg_xZn_{(1-x)}O$), zinc cadmium oxide ($Cd_xZn_{(1-x)}O$), cadmium oxide (CdO), InSnZnO (compound containing indium (In), tin (Sn), and zinc (Zn)), In (indium)-Al (aluminum)-Zn (zinc)-O (oxide)-based compounds, and amorphous oxide semiconductors that contain indium (In), gallium (Ga), and zinc (Zn) at particular ratios. Furthermore, "amorphous" and "crystalline (including polycrystal, crystallite, and c-axis oriented)" materials can be used as the oxide semiconductor. The semiconductor layer 32 may have a multilayer structure, and, in such a case, any combination of the aforementioned materials can be used. The semiconductor layer 32 of this embodiment features that particular ratios of indium (In), gallium (Ga), and zinc (Zn) are contained. According to this feature, the off-leakage current of the TFT 30 can be reduced compared to when amorphous silicon (a-Si) is used, and thus, the S/N ratio can be increased, and a high-sensitivity sensor can be obtained.

The source electrode 33 and the drain electrode 34 are, for example, formed at the same level by using the same material in the same step. Specifically, the source electrode 33 and the drain electrode 34 are formed on the gate insulating film 35 so as to contact some portions of the semiconductor layer 32. The source electrode 33 and the drain electrode 34 of this embodiment each have a three-layer structure that includes, in sequence from the substrate 20 side (lower layer side), a titanium (Ti)-containing metal film, an aluminum (Al)-containing metal film, and a titanium (Ti)-containing metal film. However, in this embodiment, the materials for the source electrode 33 and the drain electrode 34 are not limited to these.

A first insulating film 36 is disposed over the semiconductor layer 32, the source electrode 33, and the drain electrode 34 so as to cover these. The first insulating film 36 is formed of, for example, an inorganic insulating film that contains silicon oxide ($SiO_2$). However, the materials for the first insulating film 36 of this embodiment are not limited to these. The first insulating film 36 has openings in regions that overlap the source electrode 33 and the drain electrode 34 in a top view. The first insulating film 36 functions as a passivation film that protects the TFT 30.

A second insulating film 37 is disposed on the first insulating film 36. The second insulating film 37 is formed of a transparent resin, such as an acrylic resin, a siloxane resin, or a polyimide resin. However, the materials for the second insulating film 37 are not limited to these. Note that the second insulating film 37 of this embodiment also functions as a planarizing film that provides a flat surface by covering recesses and protrusions on the substrate 20.

The second insulating film 37 has openings in regions that overlap the source electrode 33 and the drain electrode 34 in a top view. Contact holes CH5 and CH3 are formed by the openings formed in the first insulating film 36 and the openings formed in the second insulating film 37.

As described above, the TFT 30 of this embodiment has a bottom-gate structure in which the gate electrode 31 is disposed on the substrate 20 side (lower layer side) with respect to the semiconductor layer 32. Alternatively, the TFT 30 may have a top-gate structure in which the gate electrode 31 is disposed on the opposite side (upper layer side) of the substrate 20 with respect to the semiconductor layer 32, or a double-gate structure in which gate electrodes 31 are disposed on both sides (lower layer side and the upper layer side) of the substrate 20 with respect to the semiconductor layer 32.

The semiconductor layer 32, the source electrode 33, and the drain electrode 34 may be integrally formed by using the same semiconductor material. Specifically, the semiconductor layer 32, the source electrode 33, and the drain electrode 34 may be integrally formed by using the same oxide semiconductor. In such a case, the source electrode 33 and the drain electrode 34 are formed by subjecting at least part thereof to a resistance-lowering process. As such, the source electrode 33 and the drain electrode 34 may be formed as low-resistance semiconductors that have higher conductivity than the semiconductor layer 32.

A first cathode electrode 38 is formed in the contact hole CH3 and on the second insulating film 37, and a first source electrode (contact plug) 39 is formed in the contact hole CH5 and on the second insulating film 37. The first cathode electrode 38 fills the inside of the contact hole CH3 and is connected to the drain electrode 34 of the TFT 30. Furthermore, the first cathode electrode 38 has a rectangular shape on the second insulating film 37 on the XY plane, and overlaps the TFT 30 in the Z direction. The first source electrode 39 fills the inside of the contact hole CH5 and is connected to the source electrode 33 of the TFT 30.

The first cathode electrode 38 and the first source electrode 39 may be, for example, formed at the same level by using the same material in the same step. The first cathode electrode 38 and the first source electrode 39 each have a three-layer structure that includes, in sequence from the substrate 20 side (lower layer side), a titanium (Ti)-containing metal film, an aluminum (Al)-containing metal film, and a titanium (Ti)-containing metal film. However, in this embodiment, the materials are not limited to these.

A third insulating film 50 is formed on the second insulating film 37 so as to cover the first cathode electrode 38 and the first source electrode 39. The third insulating film 50 covers end portions of the first cathode electrode 38 and the first source electrode 39, and has openings in center portions of the first cathode electrode 38 and the first source electrode 39.

The third insulating film 50 is an inorganic insulating film that contains an inorganic insulating material such as silicon oxide ($SiO_x$), silicon nitride ($SiN_x$), silicon oxynitride ($SiO_xN_y$) (x>y), or silicon oxynitride ($SiN_xO_y$) (x>y). However, the materials for the third insulating film 50 of this embodiment are not limited to these. In a plan view (XY plane), the third insulating film 50 has openings in regions that overlap the first cathode electrode 38 and the first source electrode 39. The third insulating film 50 functions as a passivation film that protects the first cathode electrode 38 and the first source electrode 39.

The photoelectric conversion element 40 is disposed above the substrate 20. Specifically, as illustrated in FIGS. 2B and 4A, multiple photoelectric conversion elements 40 of this embodiment are disposed above the substrate 20 and arranged into a matrix. As illustrated in FIG. 4B, the photoelectric conversion element 40 of this embodiment includes the first cathode electrode 38, a second cathode electrode 43, an anode electrode 44, and a photoelectric conversion layer 45 disposed between the second cathode electrode 43 and the anode electrode 44.

As illustrated in FIG. 4B, in the photoelectric conversion device 10 according to this embodiment, the end portion of the first cathode electrode 38 on the second insulating film 37 is covered with the third insulating film 50. In addition, the photoelectric conversion layer 45 is electrically in contact with the first cathode electrode 38 via the opening in the third insulating film 50 formed on the center portion of the first cathode electrode 38. In other words, the end portion of the photoelectric conversion layer 45 is disposed on the first cathode electrode 38 with the third insulating film 50 therebetween.

In this manner, when the first cathode electrode 38 and then the third insulating film 50 are formed and then the second cathode electrode 43 and the photoelectric conversion layer 45 are patterned by etching such as by dry etching, etching of the first cathode electrode 38 disposed as the lower layer can be suppressed. Thus, formation of leakage paths in the photoelectric conversion layer 45 caused by deposited matters generated during patterning of the photoelectric conversion layer 45 can be suppressed. As a result, the leakage current in the photoelectric conversion device 10 can be decreased.

The second cathode electrode 43 is disposed on the third insulating film 50 that covers the end portion of the first cathode electrode 38 and on the first cathode electrode 38 via the opening formed in the third insulating film 50. The second cathode electrode 43 is formed of, for example, a metal layer containing titanium (Ti). Naturally, the materials are merely exemplary.

The photoelectric conversion layer 45 includes an n-type semiconductor layer 45A1, an i-type semiconductor layer 45A2, and a p-type semiconductor layer 45A3 that are stacked in sequence from the substrate 20 side and that contain a semiconductor material. The n-type semiconductor layer 45A1 is disposed on the second cathode electrode 43. The n-type semiconductor layer 45A1 contains, for example, amorphous silicon doped with an n-type impurity such as phosphorus (P). However, the materials for the n-type semiconductor layer 45A1 of this embodiment are not limited to this.

The i-type semiconductor layer 45A2 is disposed on the n-type semiconductor layer 45A1, and is in contact with the n-type semiconductor layer 45A1. The i-type semiconductor layer 45A2 contains i-type amorphous silicon. In other words, the i-type semiconductor layer 45A2 contains intrinsic amorphous silicon. However, the materials for the i-type semiconductor layer 45A2 of this embodiment are not limited to this.

The p-type semiconductor layer 45A3 is disposed on the i-type semiconductor layer 45A2, and is in contact with the i-type semiconductor layer 45A2. The p-type semiconductor layer 45A3 contains, for example, amorphous silicon doped with a p-type impurity such as boron (B). However, the materials for the p-type semiconductor layer 45A3 of this embodiment are not limited to this.

The example described in this embodiment is the case in which the photoelectric conversion layer 45 of the photoelectric conversion element 40 includes an n-type semiconductor layer 45A1, an i-type semiconductor layer 45A2, and a p-type semiconductor layer 45A3 that are stacked in sequence from the substrate 20 side. Alternatively, the photoelectric conversion layer 45 may include a p-type semiconductor layer 45A3, an i-type semiconductor layer 45A2, and an n-type semiconductor layer 45A1 stacked in sequence from the substrate 20 side. In other words, the structure may be any as long as the i-type semiconductor layer 45A2 is located between the n-type semiconductor layer 45A1 and the p-type semiconductor layer 45A3.

The anode electrode 44 is disposed on the p-type semiconductor layer 45A3. The anode electrode 44 is formed of, for example, a transparent conductive material such as ITO (indium tin oxide). However, the materials for the anode electrode 44 are not limited to these.

In addition, a fourth insulating film 51 is disposed on the photoelectric conversion element 40 and the third insulating film 50. The fourth insulating film 51 is an inorganic insulating film that contains an inorganic insulating material such as silicon oxide ($SiO_x$), silicon nitride ($SiN_x$), silicon oxynitride ($SiO_xN_y$) (x>y), or silicon oxynitride ($SiN_xO_y$) (x>y). However, the materials for the fourth insulating film 51 of this embodiment are not limited to these.

A fifth insulating film 52 is disposed on the fourth insulating film 51. The fifth insulating film 52 is formed by using a transparent resin, such as an acrylic resin, a siloxane resin, or a polyimide resin. However, the materials for the fifth insulating film 52 of this embodiment are not limited to these.

Since the fifth insulating film 52 of this embodiment is a resin layer formed by using a resin material, the thickness thereof can be larger than the inorganic insulating film formed by using an inorganic insulating material. Thus, the fifth insulating film 52 also functions as a planarizing layer that provides a flat surface by covering recesses and protrusions formed by the TFT 30 and the photoelectric conversion element 40 on the substrate 20. As such, a flat scintillator 3 can be formed by planarizing the recesses and protrusions formed by the TFTs 30 and the photoelectric conversion elements 40.

A contact hole CH4 illustrated in FIG. 4A that reaches the anode electrode 44 is formed in the fifth insulating film 52 and the fourth insulating film 51. In addition, a contact hole CH6 that reaches the first source electrode 39 is formed in the fifth insulating film 52, the fourth insulating film 51, and the third insulating film 50. The contact holes CH5 and CH6 combined correspond to the contact hole CH2 illustrated in FIG. 4A.

A multilayer metal film 53 that includes, in sequence from the substrate 20 side (lower layer side), a titanium (Ti)-containing metal film, an aluminum (Al)-containing metal film, and a titanium (Ti)-containing metal film is disposed in the contact hole CH4 and on the fifth insulating film 52, and a transparent conductive film 54 containing a transparent conductive material such as ITO is disposed on the multilayer metal film 53. In addition, the multilayer metal film 53 and the transparent conductive film 54 on the fifth insulating film 52 function as the bias wires 23 that extend along the depth direction (Y direction) of the plane of the paper of FIG. 4B and are illustrated in FIG. 4A.

In the same manner, a multilayer metal film 55 that includes, in sequence from the substrate 20 side (lower layer side), a titanium (Ti)-containing metal film, an aluminum (Al)-containing metal film, and a titanium (Ti)-containing metal film is disposed in the contact hole CH6 and on the fifth insulating film 52, and a transparent conductive film 56 containing a transparent conductive material such as ITO is disposed on the multilayer metal film 55. In addition, the multilayer metal film 55 and the transparent conductive film 56 on the fifth insulating film 52 function as the data wires 22 that extend along the depth direction (Y direction) of the plane of the paper of FIG. 4B and are described in FIG. 4A. Here, the bias wires 23 and the data wires 22 may be formed in the same step by using the same material. However, the materials for the data wires 22 and the bias wires 23 are not limited to these.

A sixth insulating film 57 is disposed on the fifth insulating film 52 so as to cover the data wires 22 and the bias wires 23. The sixth insulating film 57 is, for example, an inorganic insulating film that contains an inorganic insulating material such as silicon oxide ($SiO_x$), silicon nitride ($SiN_x$), silicon oxynitride ($SiO_xN_y$) (x>y), or silicon oxynitride ($SiN_xO_y$) (x>y). However, the materials for the sixth insulating film 57 of this embodiment are not limited to these.

A seventh insulating film 58 is disposed on the sixth insulating film 57. The seventh insulating film 58 is formed by using, for example, a transparent resin such as an acrylic resin, a siloxane resin, or a polyimide resin. However, the materials for the seventh insulating film 58 of this embodiment are not limited to these.

Since the seventh insulating film 58 of this embodiment is a resin layer formed by using a resin material, the thickness thereof can be larger than the inorganic insulating film formed by using an inorganic insulating material. Thus, the seventh insulating film 58 also functions as a planarizing layer that provides a flat surface by covering recesses and protrusions formed by the TFT 30, the photoelectric conversion element 40, the data wires 22, the bias wires 23, etc. As such, a flat scintillator 3 can be formed by planarizing the recesses and protrusions formed by the TFT 30, the photoelectric conversion element 40, the data wires 22, the bias wires 23, etc.

In other words, according to the photoelectric conversion device 10 of this embodiment, multiple resin layers (in this embodiment, three layers, namely, the second insulating film 37, the fifth insulating film 52, and the seventh insulating film 58) that can be made thicker than inorganic insulating films are formed; thus, compared to a structure that does not include multiple resin layers, the surface of the photoelectric conversion region can be made more flat. As a result, since the scintillator 3 can be made flat, the scintillation light can directly enter the photoelectric conversion element 40. Thus, a high-performance X-ray imaging device 1 can be obtained.

Figure 4C:
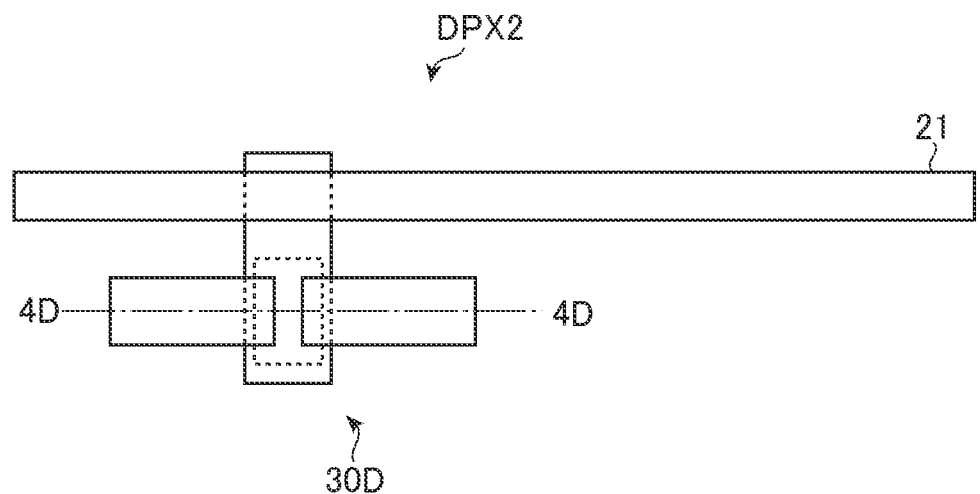
FIG. 4C is a plan view of a dummy pixel of the photoelectric conversion device according to the first embodiment.
Figure 4C:
Figure 4C:
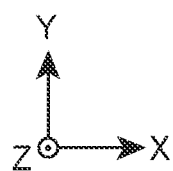

The structure of a dummy pixel DPX1 is substantially the same as the pixel PX described by referring to FIGS. 4A and 4B; however, the difference is that the gate electrode of the TFT 30D of the dummy pixel DPX1 is electrically floating. The gate electrode is not connected to any of the wires including the gate wires 21, and is surrounded by an insulating film. Next, the structure of the dummy pixel DPX2 is described. FIG. 4C is a partial top view illustrating structures near the photoelectric conversion element 40 of one dummy pixel DPX2, and corresponds to FIG. 4A illustrating the pixel PX.

As illustrated in FIG. 4C, the TFT 30D of this embodiment is disposed in a region surrounded by the gate wires 21 in a top view (XY plane) as with the TFT 30 of the pixel PX. The plan pattern of the TFT 30D is substantially the same as the plan pattern of the TFT 30. The dummy pixel DPX2 differs from the pixel PX in that the dummy pixel DPX2 is not connected to the gate wires 21 or the data wires 22, and in that the photoelectric conversion element 40 is omitted. Thus, the gate electrode, the source electrode, and the drain electrode of the TFT 30D are in an electrically floating state.

Figure 4D:
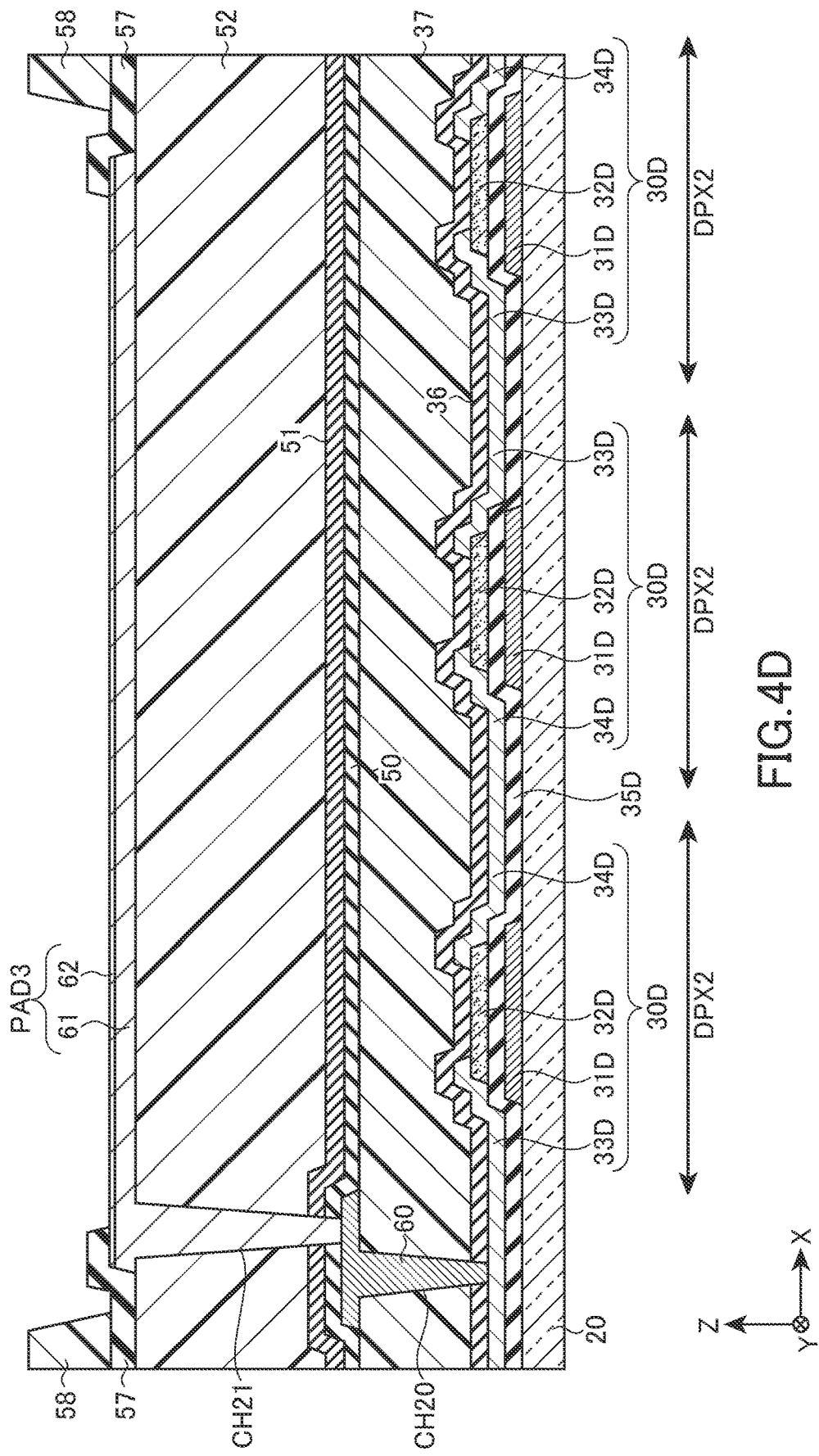
FIG. 4D is a cross-sectional view taken in a direction along line 4D-4D in FIG. 4C.

FIG. 4D is a cross-sectional view taken in a direction along line 4D-4D in FIG. 4C. Note that FIG. 4D does not completely correspond to FIG. 4C, and corresponds to a region to be connected to the external connection terminals PAD in a direction along line 4D-4D. In the example illustrated in FIG. 4D, three TFTs 30D are disposed in the X direction.

As illustrated in the drawing, the TFT 30D of the dummy pixel DPX2 includes a gate electrode 31D, a semiconductor layer 32D, a source electrode 33D, and a drain electrode 34D. The gate electrode 31D, the source electrode 33D, and the drain electrode 34D are each a metal layer used in forming the TFT 30D. These layers have similar structures to the gate electrode 31, the semiconductor layer 32, the source electrode 33, and the drain electrode 34 of the TFT 30 described with reference to FIG. 4B, and are formed in the same step by using the same material to the same thickness. In addition, in the example illustrated in FIG. 4D, the adjacent TFTs 30D in the X direction have the source electrodes 33D commonly connected to each other and the drain electrodes 34D commonly connected to each other.

Furthermore, a gate insulating film 35D covering the gate electrode 31D is disposed on the substrate 20. A semiconductor layer 32D is disposed on the gate insulating film 35D. The gate insulating film 35D can also be formed in the same step by using the same material to the same thickness as the gate insulating film 35, for example.

As in the pixel region PXR, a first insulating film 36 and a second insulating film 37 are disposed over the semiconductor layer 32D, the source electrode 33D, and the drain electrode 34D so as to cover these. In addition, a contact hole CP20 that reaches the source electrode 33D of the TFT 30D is formed in the first insulating film 36 and the second insulating film 37. The contact hole CP20 may be formed in the same step as the step for forming the contact holes CH5 and CH3, for example.

A first electrode 60 is disposed in the contact hole CH20 and on the second insulating film 37. The first electrode 60 may be, for example, formed at the same level by using the same material in the same step as the first cathode electrode 38 and the first source electrode 39. A third insulating film 50, a fourth insulating film 51, and a fifth insulating film 52 are formed on the second insulating film 37 as in the pixel region PXR so as to cover the first electrode 60.

A contact hole CH21 that reaches the first electrode 60 is formed in the third insulating film 50, the fourth insulating film 51, and the fifth insulating film 52. The contact hole CH21 may be formed in the same step as the step for forming the contact holes CH4 and CH6, for example. Furthermore, a multilayer metal film 61 is disposed on the contact hole CH21 and the fifth insulating film 52, and a transparent conductive film 62 is disposed on the multilayer metal film 61. These films can also be formed at the same level in the same step by using the same material as the multilayer metal film 53 and the transparent conductive film 54 in the pixel region PXR. In addition, the multilayer metal film 61 and the transparent conductive film 62 on the fifth insulating film 52 function as the external connection terminals PAD illustrated in FIG. 2A.

In the example illustrated in FIG. 4D, the multilayer metal film 61 and the transparent conductive film 62 are connected to the source electrodes 33D of the TFT 30D and thus function as external connection terminals PAD2 connected to the data wires 22. As illustrated in FIG. 2B, the source electrodes 33 and 33D of the TFTs 30 and 30D located on the same column are commonly connected to one external connection terminal PAD2. Thus, for example, a source electrode 33D in contact with the first electrode 60 may be electrically connected to TFTs 30 and 30D that are located on the same column as the TFT 30D that has this source electrode 33D through wires not illustrated in the drawing. In this manner, an image signal read-out from one of the pixels PX on the same column is transferred to the external connection terminal PAD2 through the source electrode 33D of the TFT 30D of the second dummy pixel DPX2.

The same applies to the external connection terminals PAD1 and PAD3. As illustrated in FIG. 2B, the external connection terminals PAD1 are disposed in a region that is inside the second dummy region DR2 and is adjacent to the pixel region PXR in the X direction. As illustrated in FIG. 4D, the external connection terminal PAD1 also overlaps the dummy pixel DPX2 in the Z direction, and the external connection terminal PAD1 and the gate wire 21 are electrically connected through the contact holes CP20 and CP21 disposed on the gate wire 21.

In the example illustrated in FIG. 2A, the external connection terminal PAD3 is disposed on the second dummy region DR2 and is adjacent to the external connection terminals PAD2 in the X direction. As illustrated in FIG. 4D, the external connection terminal PAD3 also overlaps the dummy pixel DPX2 in the Z direction. In addition, for example, in the pixel region PXR, the second dummy region DR2, and the border regions thereof, the bias wires 23 are commonly connected through a wire not illustrated in the drawing. The external connection terminal PAD3 is electrically connected to this wire via the contact plug CP20 and/or CP21 illustrated in FIG. 4D.

The positions where the external connection terminals PAD1 to PAD3 are disposed are not limited to the case illustrated in FIG. 2A and may be any positions on the second dummy region DR2. Alternatively, at least some of these terminals may be located on the first dummy region DR1. Alternatively, in the XY plane illustrated in FIG. 2A, these terminals may surround the active area AA. Furthermore, the contact plugs CP20 and CP21 may be disposed inside the second dummy region DR2 or at the border region between the pixel region PXR and the second dummy region DR2.

As discussed above, according to the structure of this embodiment, the external connection terminals PAD are above the second dummy region DR2 around the pixel region PXR. In other words, the external connection terminals PAD are formed to overlap the dummy pixels DPX2 in the second dummy region DR2. As a result, the pixel region PXR and the second dummy region DR2 are adjacent to each other on the substrate 20. Thus, the TFTs 30 in the pixel regions PXR and the TFTs 30D in the dummy region DR2 are arranged into a substantially the same pattern on the substrate 20. Thus, the micro loading effect can be suppressed, and nonuniformity of the shapes of the TFTs 30 in the pixel regions PXR can be suppressed. Thus, nonuniformity of characteristics of the TFTs 30 can be suppressed, the performance of the TFTs 30 can be made substantially uniform in the active area AA, and thus the electrical characteristics can be improved.

Furthermore, the external connection terminals PAD are not at the same level as the TFTs 30 and the photoelectric conversion elements 40, but at a higher level. Thus, there is no need to form a region for external connection terminals PAD between the pixel region PXR and the second dummy region DR2, for example. As a result, the dummy pixels DPX2 can be formed without increasing the panel size (for example, the substrate 20) of the photoelectric conversion device 10.

Next, a method for producing the photoelectric conversion device 10 of this embodiment is described. FIGS. 5A to 5G are cross-sectional views that sequentially illustrate steps for producing the photoelectric conversion device 10. In FIGS. 5A to 5G, a pixel region PXR and a second dummy region DR2 are illustrated, and, in particular, for the pixel region PXR, the active area AA is illustrated. Illustration and description of the first dummy region DR1 are omitted since the first dummy region DR1 can be formed by the same method as the method for forming the active area AA, for example.

Figure 5A:
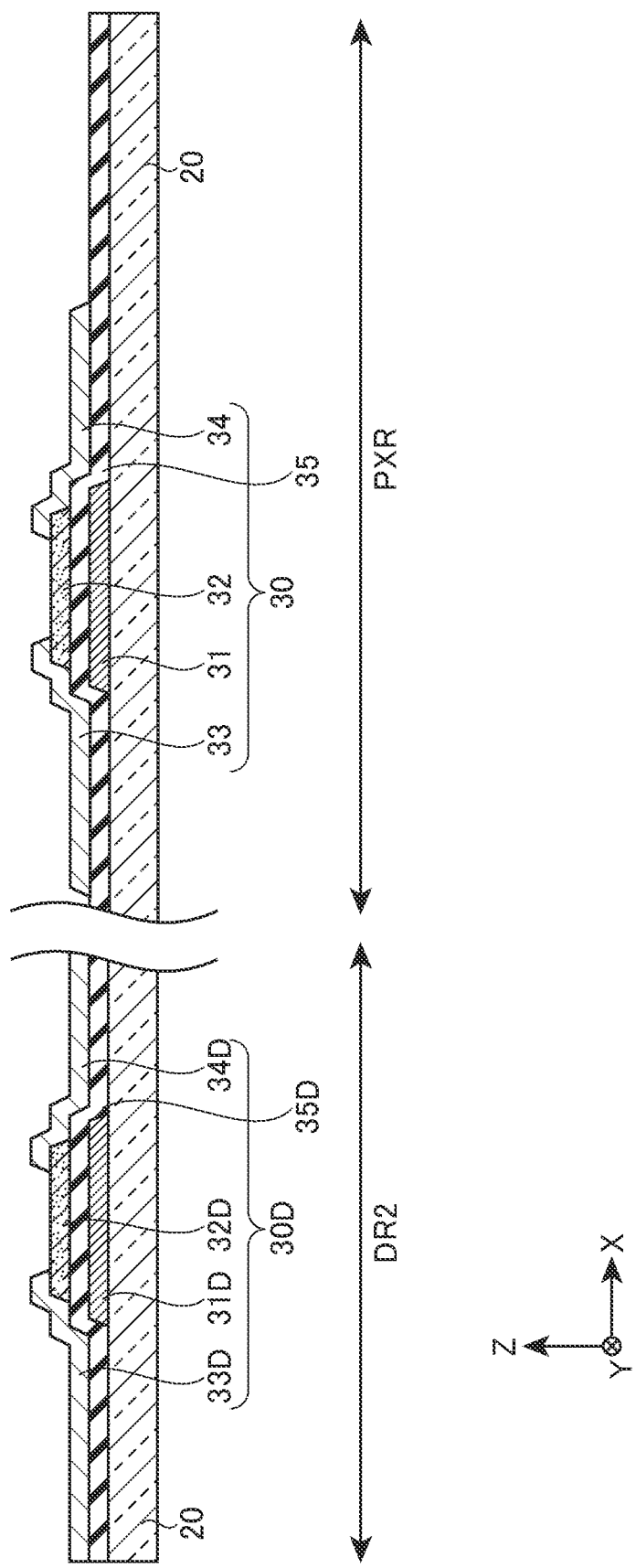
FIG. 5A is a cross-sectional view illustrating a first production step of the photoelectric conversion device according to the first embodiment.

First, as illustrated in FIG. 5A, TFTs 30 and 30D and gate insulating films 35 and 35D are formed on a substrate 20.

Figure 5B:
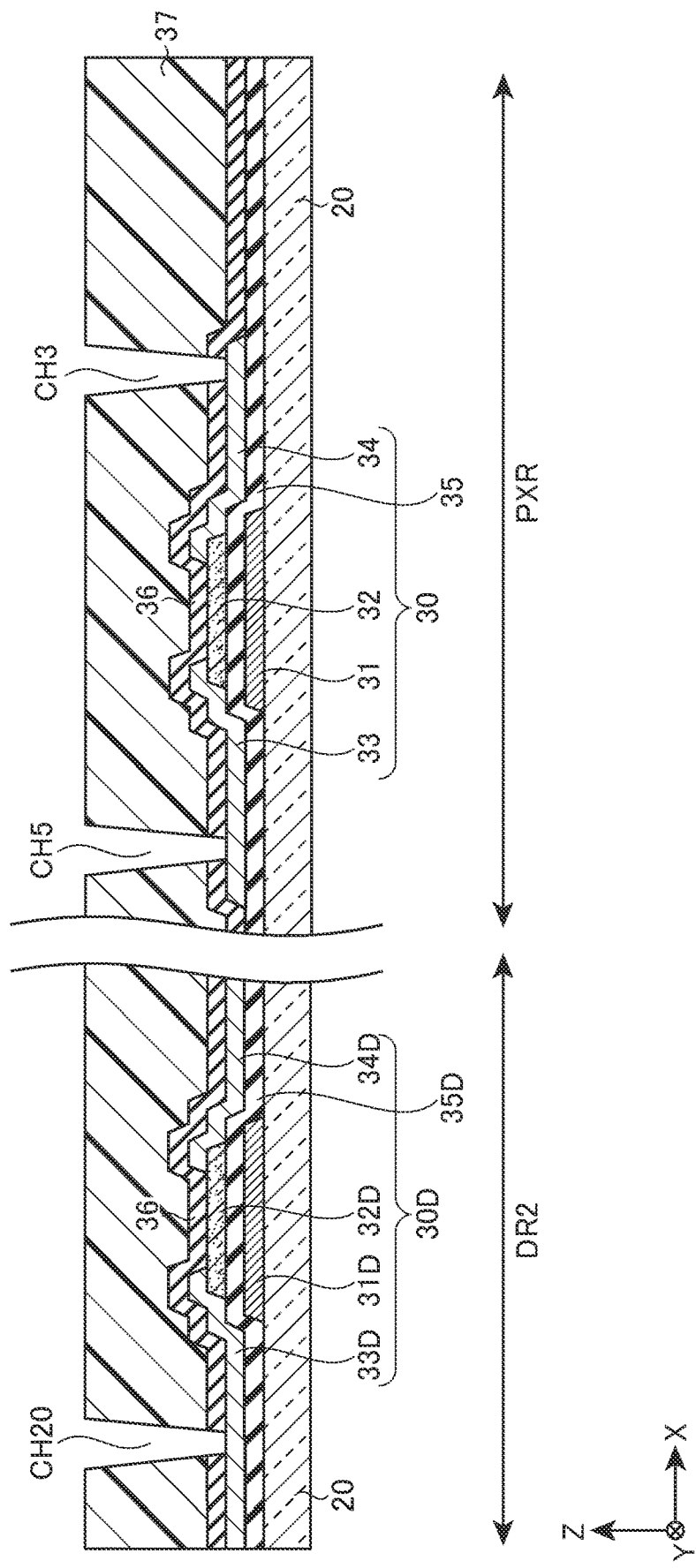
FIG. 5B is a cross-sectional view illustrating a second production step of the photoelectric conversion device according to the first embodiment.

Next, as illustrated in FIG. 5B, a first insulating film 36 containing silicon oxide ($SiO_2$) is formed by, for example, a plasma CVD (chemical vapor deposition) method. Next, the first insulating film 36 is patterned by, for example, photolithography and dry etching. As a result, a first insulating film 36 having openings on the source electrodes 33 and 33D and the drain electrode 34 is formed. Subsequently, a second insulating film 37 containing an acrylic resin, a siloxane resin, or a polyimide resin is formed by, for example, a slit coating method. Next, the second insulating film 37 is patterned by, for example, photolithography and dry etching. As a result, openings that overlap the openings in the first insulating film 36 in a top view (XY plane) are formed in the second insulating film 37, and contact holes CH3, CH5, and CH20 are formed by these openings.

Figure 5C:
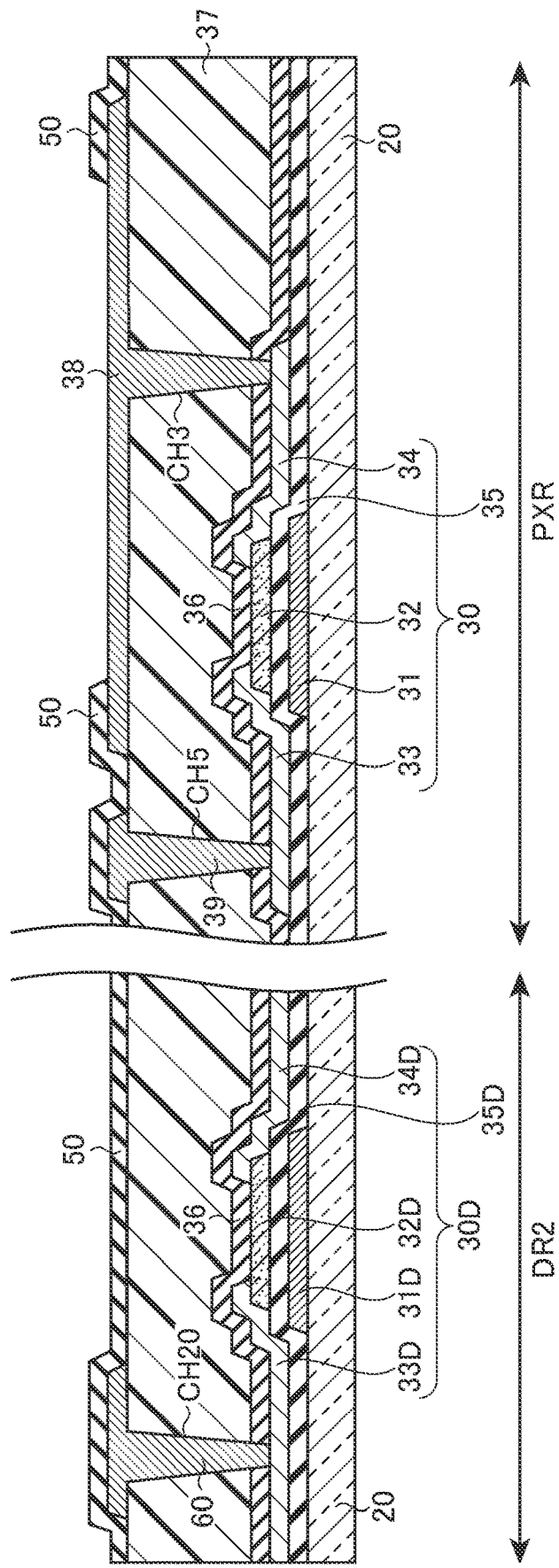
FIG. 5C is a cross-sectional view illustrating a third production step of the photoelectric conversion device according to the first embodiment.

Next, as illustrated in FIG. 5C, a metal layer is formed by sequentially stacking titanium (Ti), aluminum (Al), and titanium (Ti) by, for example, a sputtering method, and then is patterned by photolithography and, for example, wet etching. As a result, electrodes 38, 39, and 60 that fill the contact holes CH3, CH5, and CH20 are formed on the second insulating film 37. Subsequently, a third insulating film 50 is formed on the second insulating film 37 by forming an inorganic insulating film that covers the electrodes 38, 39, and 60 and that contains an inorganic insulating material such as silicon oxide ($SiO_x$), silicon nitride ($SiN_x$), silicon oxynitride ($SiO_xN_y$) (x>y), or silicon oxynitride ($SiN_xO_y$) (x>y). Next, the third insulating film 50 is patterned by, for example, photolithography and dry etching. As a result, an opening that exposes the first cathode electrode 38 in a top view is formed.

Figure 5D:
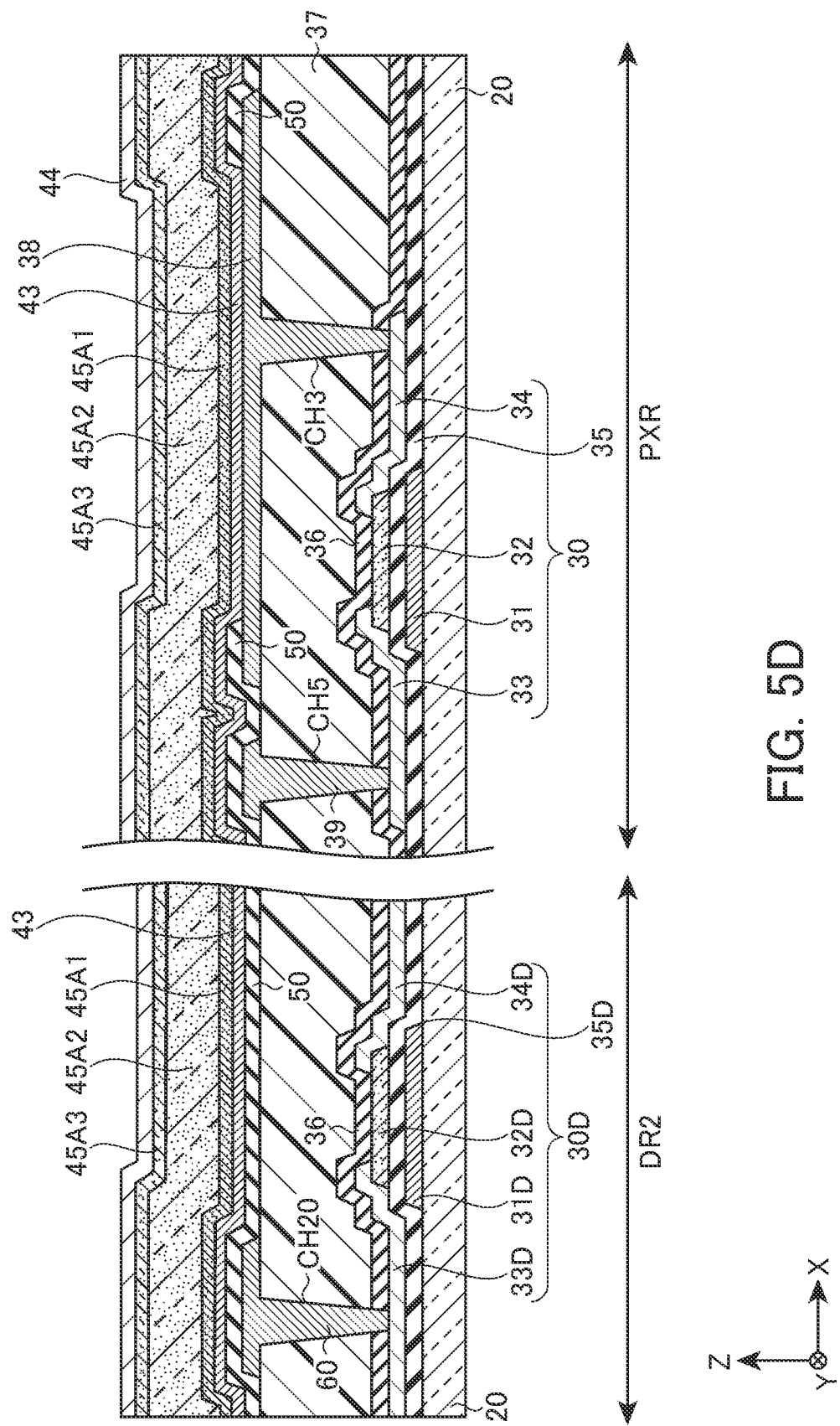
FIG. 5D is a cross-sectional view illustrating a fourth production step of the photoelectric conversion device according to the first embodiment.

Next, as illustrated in FIG. 5D, a second cathode electrode 43 containing, for example, titanium (Ti) is formed by, for example, a sputtering method on the third insulating film 50 and the first cathode electrode 38. Next, an n-type semiconductor layer 45A1, an i-type semiconductor layer 45A2, and a p-type semiconductor layer 45A3 are sequentially formed on the second cathode electrode 43 by, for example, a plasma CVD method. Subsequently, an anode electrode 44 that contains ITO is formed on the p-type semiconductor layer 45A3 by, for example, a sputtering method.

Figure 5E:
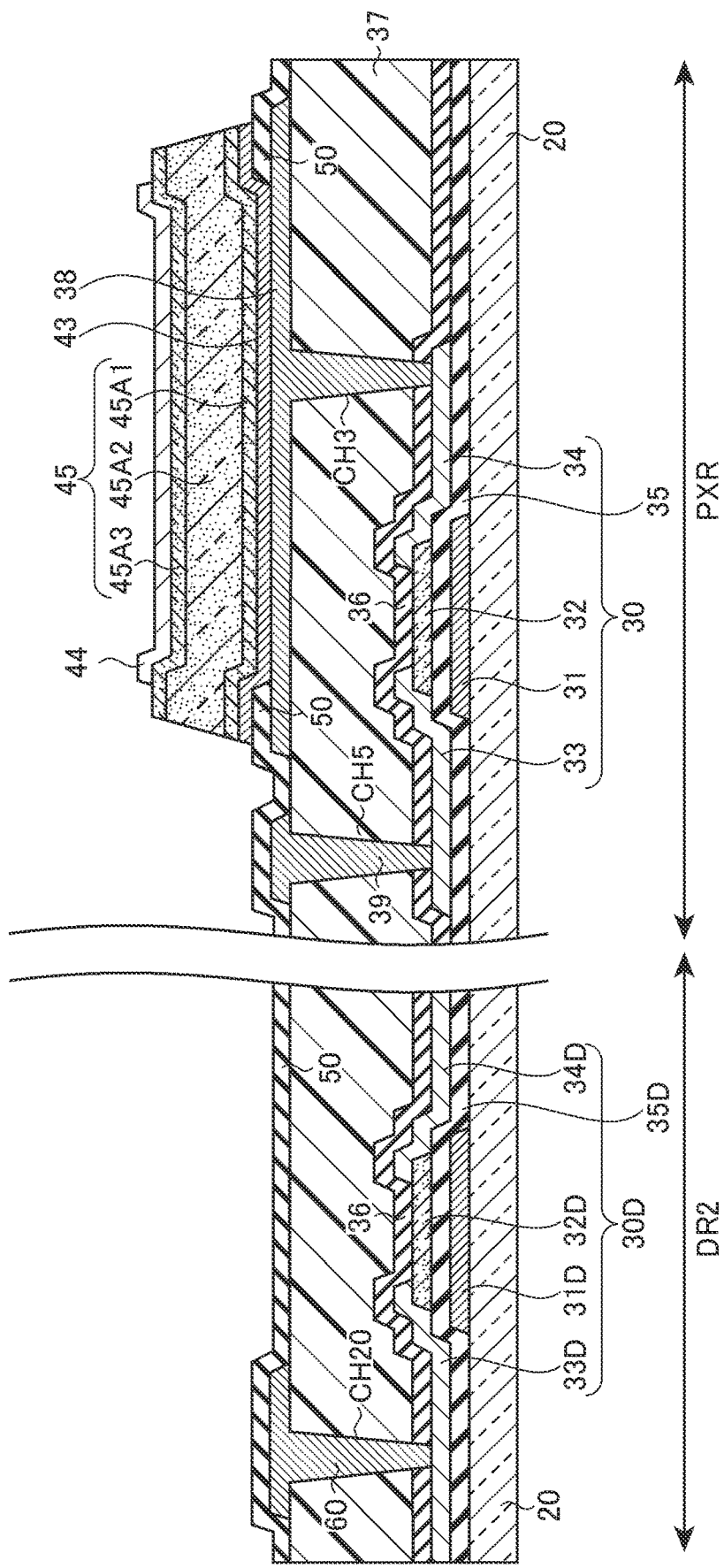
FIG. 5E is a cross-sectional view illustrating a fifth production step of the photoelectric conversion device according to the first embodiment.

Next, as illustrated in FIG. 5E, the anode electrode 44 is patterned by, for example, photolithography or dry etching. Next, the second cathode electrode 43, the n-type semiconductor layer 45A1, the i-type semiconductor layer 45A2, and the p-type semiconductor layer 45A3 are patterned by, for example, photolithography and dry etching. Thus, a photoelectric conversion layer 45 is formed in a region that overlaps the first cathode electrode 38 in a top view. As a result, in the second dummy region DR2, the second cathode electrode 43, the n-type semiconductor layer 45A1, the i-type semiconductor layer 45A2, the p-type semiconductor layer 45A3, and the anode electrode 44 are removed.

Figure 5F:
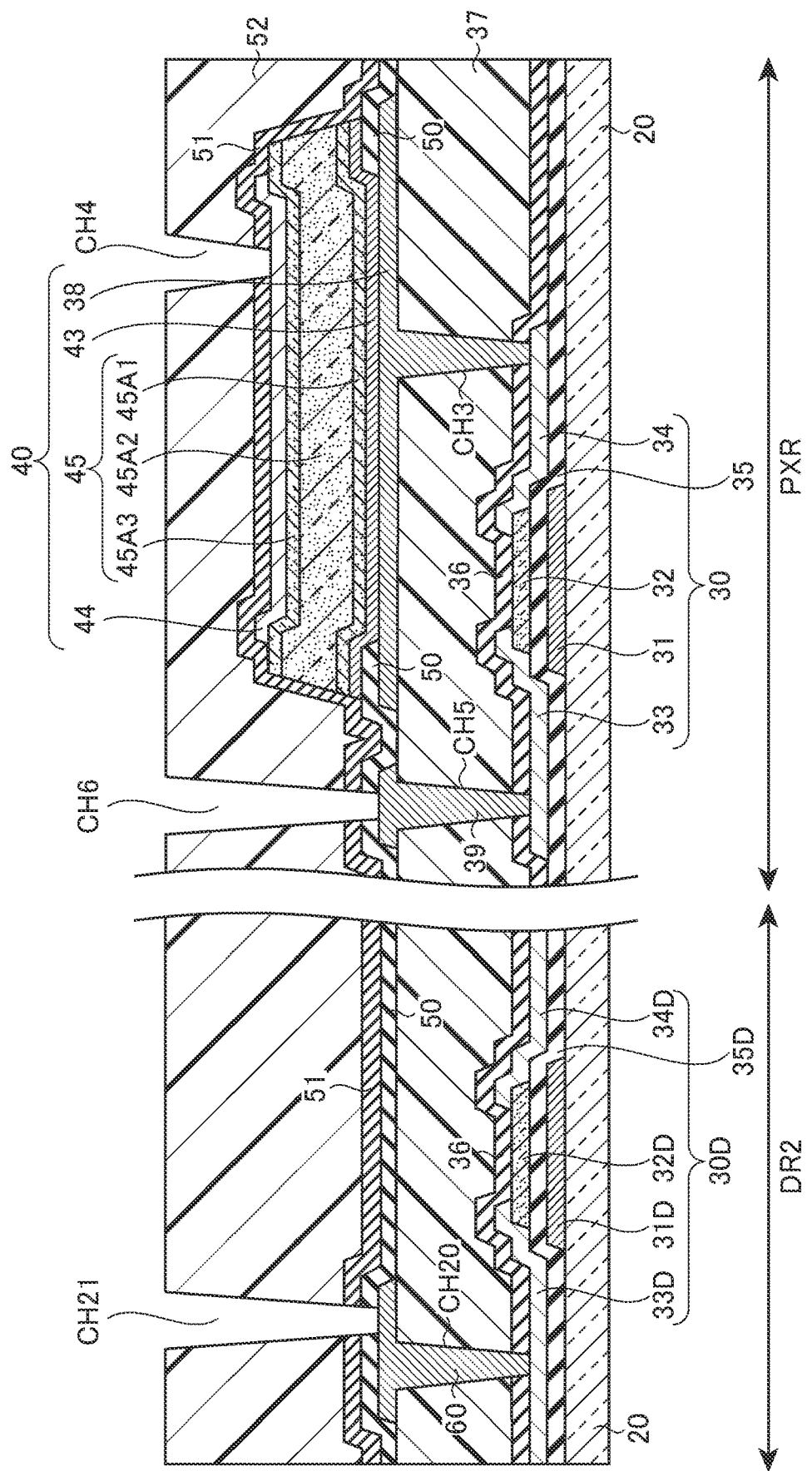
FIG. 5F is a cross-sectional view illustrating a sixth production step of the photoelectric conversion device according to the first embodiment.

Next, as illustrated in FIG. 5F, a fourth insulating film 51 that contains an inorganic insulating material such as silicon oxide ($SiO_x$), silicon nitride ($SiN_x$), silicon oxynitride ($SiO_xN_y$) (x>y), or silicon oxynitride ($SiN_xO_y$) (x>y) is formed on the photoelectric conversion layer 45, the anode electrode 44, and the third insulating film 50. Next, the fourth insulating film 51 and the third insulating film 50 are patterned by, for example, photolithography and dry etching. As a result, openings that expose the electrodes 44, 39, and 60 in a top view are formed. Subsequently, a fifth insulating film 52 containing an acrylic resin, a siloxane resin, or a polyimide resin is formed by, for example, a slit coating method. Next, the fifth insulating film 52 is patterned by, for example, photolithography and dry etching. As a result, openings that overlap the openings in the fourth insulating film 51 in a top view are formed in the fifth insulating film 52, and contact holes CH4, CH6, and CH21 are formed by these openings.

Figure 5G:
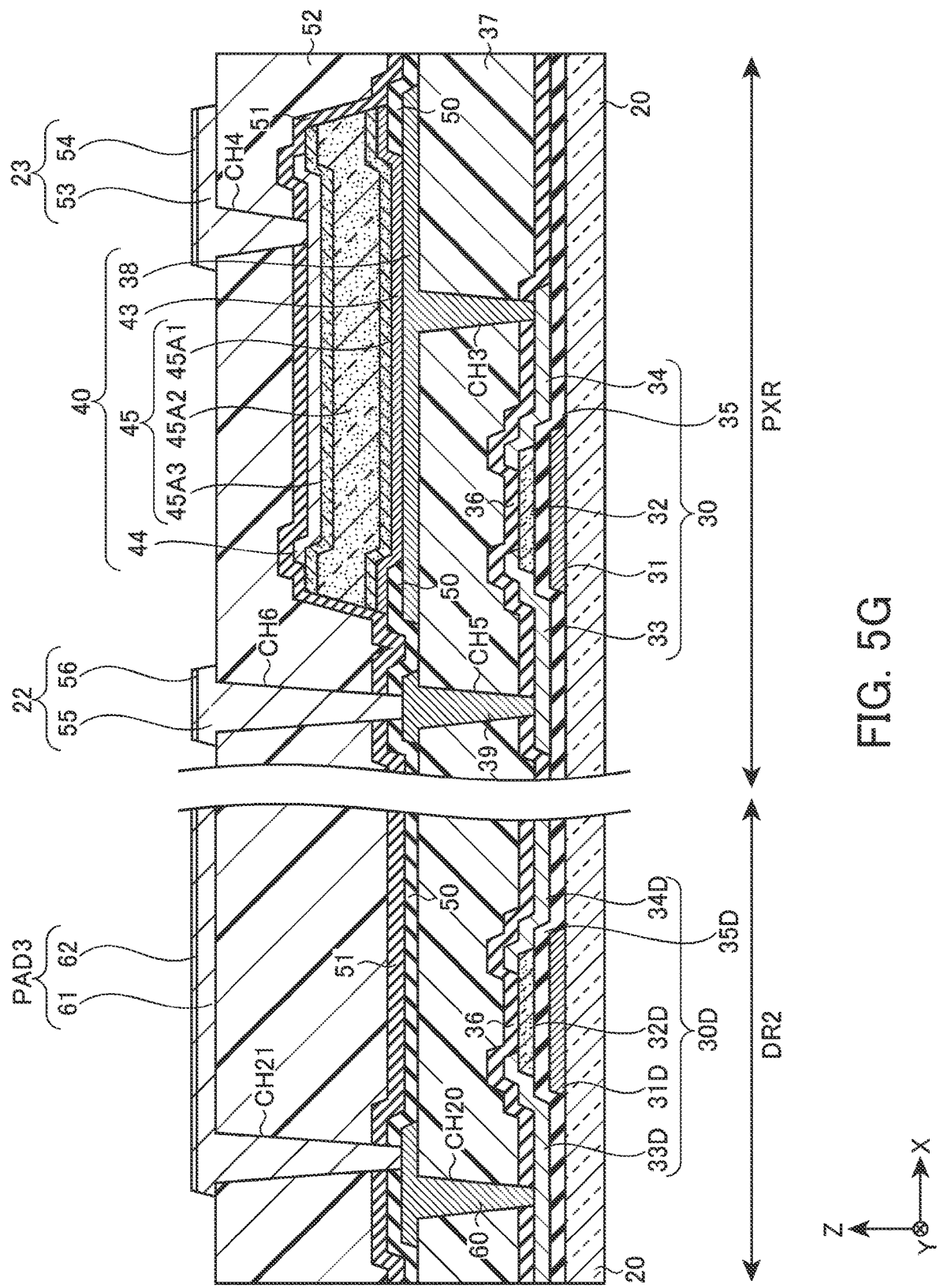
FIG. 5G is a cross-sectional view illustrating a seventh production step of the photoelectric conversion device according to the first embodiment.

Next, as illustrated in FIG. 5G, a multilayer metal film 53 formed by sequentially stacking titanium (Ti), aluminum (Al), and titanium (Ti) by, for example, sputtering, and a transparent conductive film 54 containing ITO are formed on the fifth insulating film 52 so as to fill the contact hole CH4. In the same manner, a multilayer metal film 55 formed by sequentially stacking titanium (Ti), aluminum (Al), and titanium (Ti) by, for example, sputtering, and a transparent conductive film 56 containing ITO are formed on the fifth insulating film 52 so as to fill the contact hole CH6. In the same manner, a multilayer metal film 61 formed by sequentially stacking titanium (Ti), aluminum (Al), and titanium (Ti) by, for example, sputtering, and a transparent conductive film 62 containing ITO are formed on the fifth insulating film 52 so as to fill the contact hole CH21. The multilayer metal films 53, 55, and 61 may be formed in the same step by using the same materials, and the transparent conductive films 54, 56, and 62 may also be formed in the same step by using the same material. Next, as illustrated in FIG. 5G, the multilayer metal films 53, 55, and 61, and the transparent conductive films 54, 56, and 62 are patterned by, for example, photolithography and dry etching. As a result, wires 23 and 22 and external connection terminals PAD2 that fill the contact holes CH4, CH6, and CH21 are formed on the fifth insulating film 52. The external connection terminals PAD2 are formed so as to overlap the dummy pixels DPX2 in the X direction. The external connection terminals PAD1 and PAD3 may also be formed in the same step by using the same material as the external connection terminals PAD2.

Subsequently, a sixth insulating film 57 and a seventh insulating film 58 are formed on the fifth insulating film 52 so as to cover the wires 23 and 22 and the external connection terminals PAD1, PAD2, and PAD3. Then, for example, the external connection terminals PAD1, PAD2, and PAD3 are exposed by photolithography and dry etching, as a result of which the structure illustrated in FIGS. 4A to 4D is completed.

Second Embodiment

Next, a second embodiment is described. Although the case in which two layers, namely, the insulating films 37 and 52, are used as planarizing films is described in the first embodiment, one planarizing film is used in this embodiment to achieve what is achieved in the first embodiment. In the description below, the features different from the first embodiment are described.

Figure 6A:
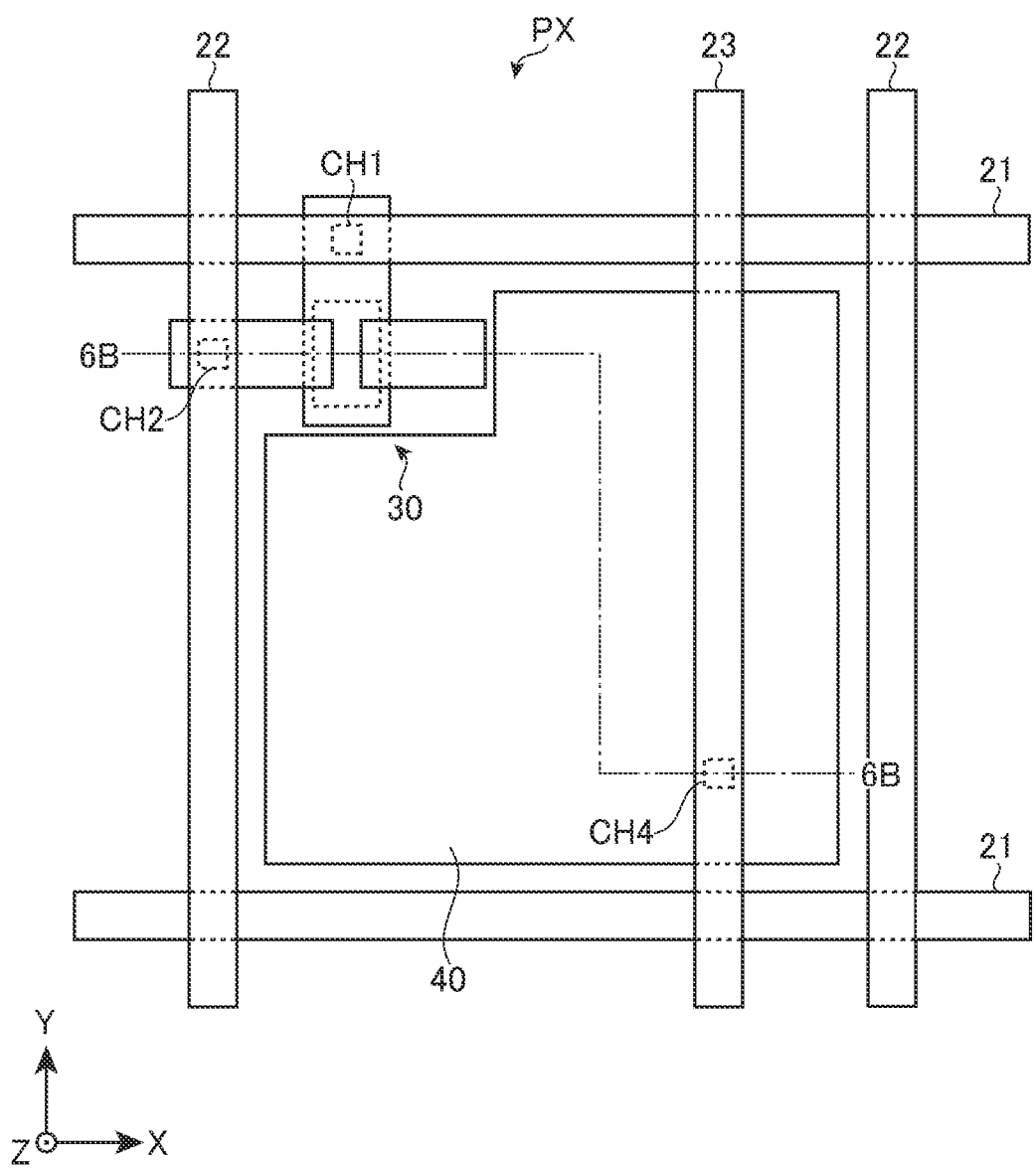
FIG. 6A is a plan view of a pixel in a photoelectric conversion device according to a second embodiment.

FIG. 6A is a partial top view (XY plane) illustrating structures near the photoelectric conversion element 40 of the pixel PX of this embodiment, and corresponds to FIG. 4A described in the first embodiment. As illustrated in FIG. 6A, the TFT 30 and the photoelectric conversion element 40 of the present embodiment are disposed in a region surrounded by the gate wires 21 and the data wires 22 in a top view as in the first embodiment. This embodiment is different from the first embodiment in that, in a top view, the TFT 30 does not overlap the photoelectric conversion element 40 (in particular, the photoelectric conversion layer 45). In other words, a structure obtained by removing the photoelectric conversion element 40 from the region that overlaps the TFT 30 in FIG. 4A is the structure of this embodiment. Other features are the same as in the first embodiment. In addition, the planar structure of the dummy pixel DPX1 is the same as that illustrated in FIG. 6A, and the planar structure of the dummy pixel DPX2 is the same as that illustrated in FIG. 4C; thus, the descriptions therefor are omitted.

Figure 6B:
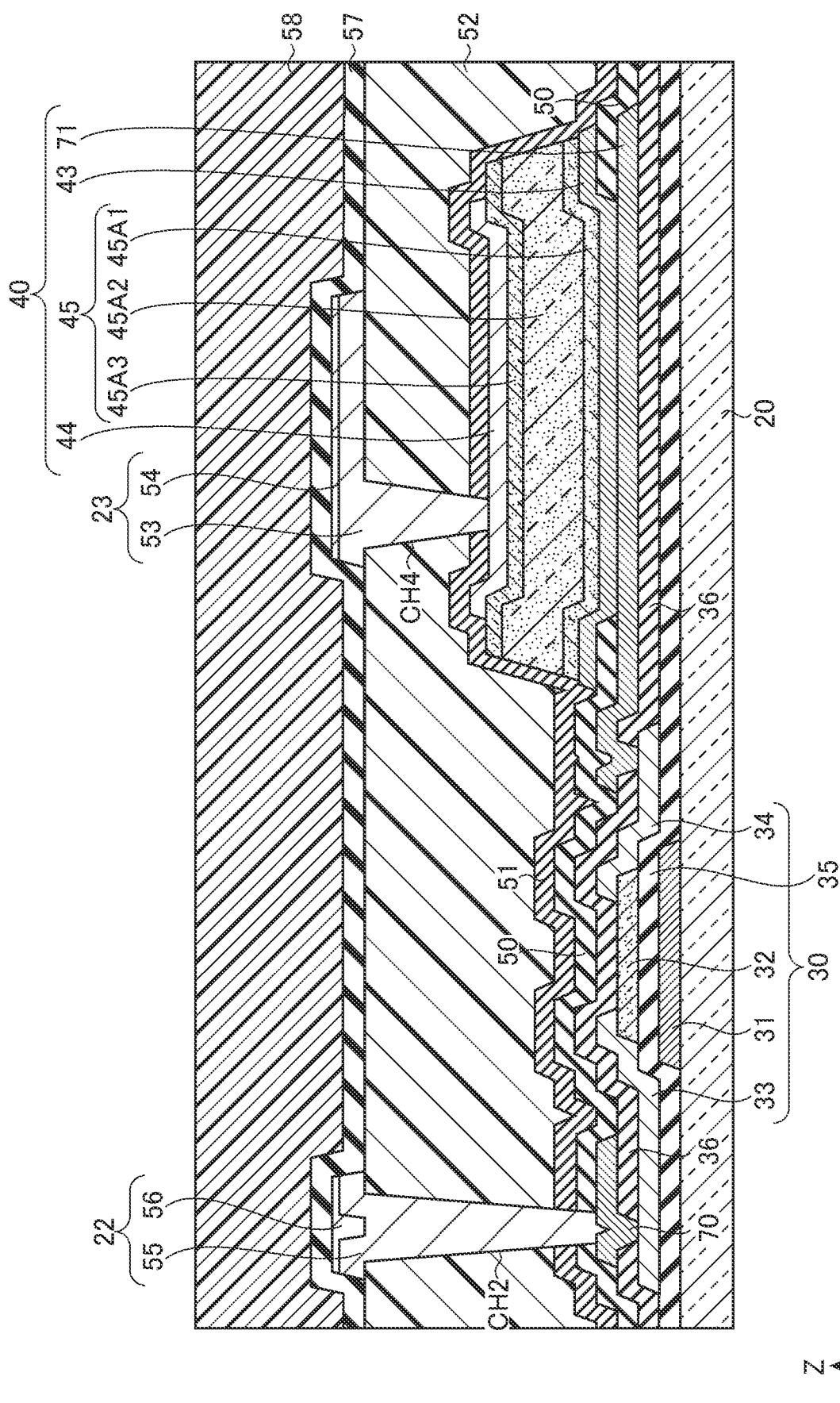
FIG. 6B is a cross-sectional view taken along line 6B-6B in FIG. 6A.

FIG. 6B is a cross-sectional view taken along line 6B-6B in FIG. 6A. In the description below, the features different from FIG. 4B described in the first embodiment are described. As illustrated in the drawings, the first insulating film 36 is formed on the TFT 30 and the gate insulating film 35. As illustrated in FIG. 4B, openings that reach the source electrode 33 and the drain electrode 34 are formed in the first insulating film 36. In addition, a first source electrode 70 is formed in the opening that reaches the source electrode 33 and on the first insulating film 36, and a first cathode electrode 71 is formed in the opening that reaches the drain electrode 34 and on the first insulating film 36. The first cathode electrode 71 corresponds to the first cathode electrode 71 on the second insulating film 37 in FIG. 4B described in the first embodiment, and is, for example, formed to have a rectangular shape on the XY plane on the first insulating film 36.

The first cathode electrode 71 and the first source electrode 70 may be, for example, formed at the same level by using the same material in the same step. The first cathode electrode 71 and the first source electrode 70 each have a three-layer structure that includes, in sequence from the substrate 20 side (lower layer side), a titanium (Ti)-containing metal film, an aluminum (Al)-containing metal film, and a titanium (Ti)-containing metal film. However, in this embodiment, the materials are not limited to these.

Furthermore, as in the first embodiment, a third insulating film 50 is formed on the first insulating film 36 so as to cover the first cathode electrode 71 and the first source electrode 70. The third insulating film 50 covers end portions of the first cathode electrode 71 and the first source electrode 70, and has openings in center portions of the first cathode electrode 71 and the first source electrode 70.

As in the first embodiment, a second cathode electrode 43, an anode electrode 44, and a photoelectric conversion layer 45 disposed between the second cathode electrode 43 and the anode electrode 44 are formed on the first cathode electrode 71. In addition, a fourth insulating film 51 is formed on the photoelectric conversion layer 45, the anode electrode 44, and the third insulating film 50. Then a fifth insulating film 52 is formed on the fourth insulating film 51.

Contact holes CH2 and CH4 that reach the first source electrode 70 and the anode electrode 44 are formed in the fifth insulating film 52, the fourth insulating film 51, and the third insulating film 50. Other features are the same as in the first embodiment, and the descriptions therefor are omitted.

Figure 6C:
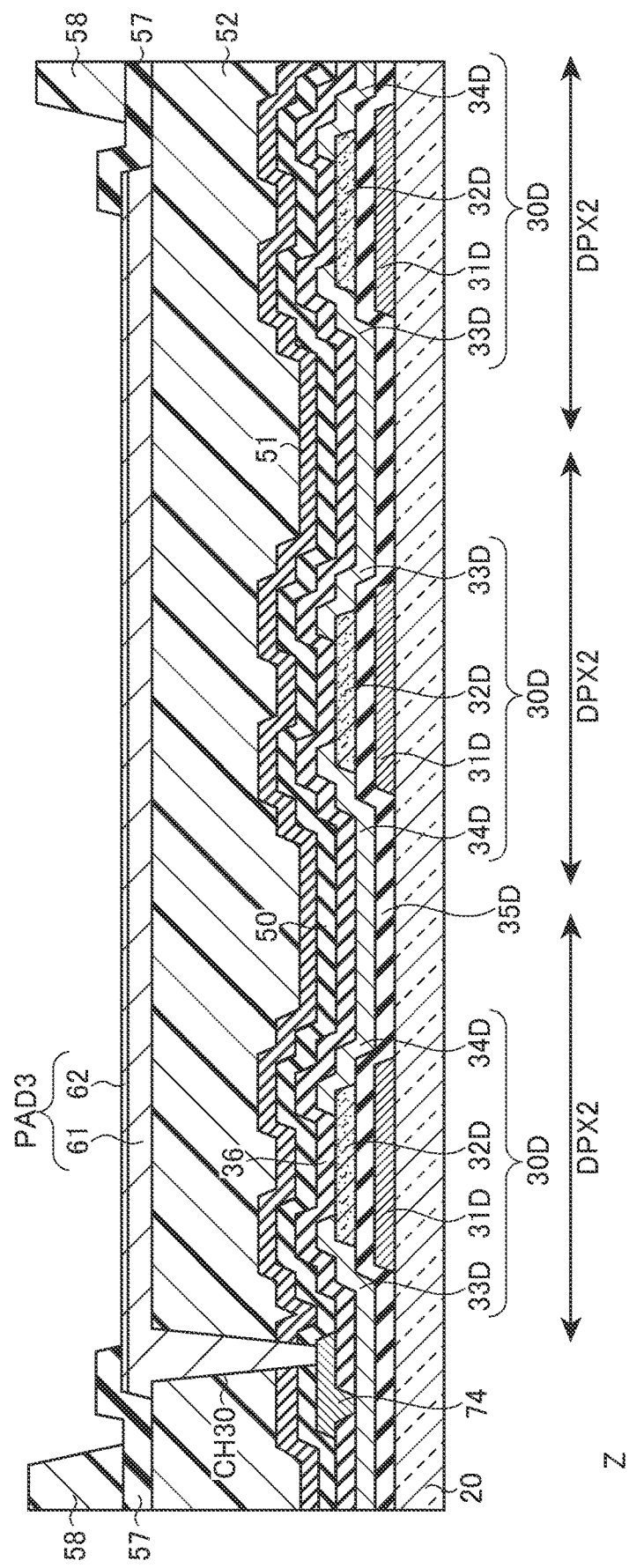
FIG. 6C is a cross-sectional view of a second dummy region illustrated in FIG. 6A.

The structure of a dummy pixel DPX1 is the same as the pixel PX described by referring to FIGS. 6A and 6B; thus, the description therefor is omitted. Thus, the structure of the dummy pixel DPX2 is described next. Since the planar structure of the dummy pixel DPX2 is the same as that illustrated in FIG. 4C, the description therefor is also omitted. FIG. 6C is a cross-sectional view of the dummy region DR2 of this embodiment, and corresponds to FIG. 4D described in the first embodiment. The structure of the dummy region DR2 of this embodiment differs from the first embodiment in the following points.

The third insulating film 50 is formed on the first insulating film 36, the fourth insulating film 51 is formed on the third insulating film 50, and the fifth insulating film 52 is formed on the fourth insulating film 51.

A metal film 74 in contact with the source electrode 33D is formed on the first insulating film 36, a contact hole CH30 that reaches the metal film 74 is formed in the fifth insulating film 52, and external connection terminals PAD2 that include the multilayer metal film 61 and the transparent conductive film 62 are formed to fill the CH30. Note that the metal film 74 is formed at the same level in the same step by using the same materials as the first source electrode 70 described with reference to FIG. 6B, for example.

As described above, the structure described in the first embodiment is also applicable to the case where the planarizing film is one layer. According to this structure, the production process can be simplified by using one layer of the planarizing film.

Third Embodiment

Next, a third embodiment is described. This embodiment relates to a structure obtained by adding ESD (electro-static discharge) elements to the structure described in the first embodiment above. In the description below, only the features different from the first embodiment are described.

Figure 7:
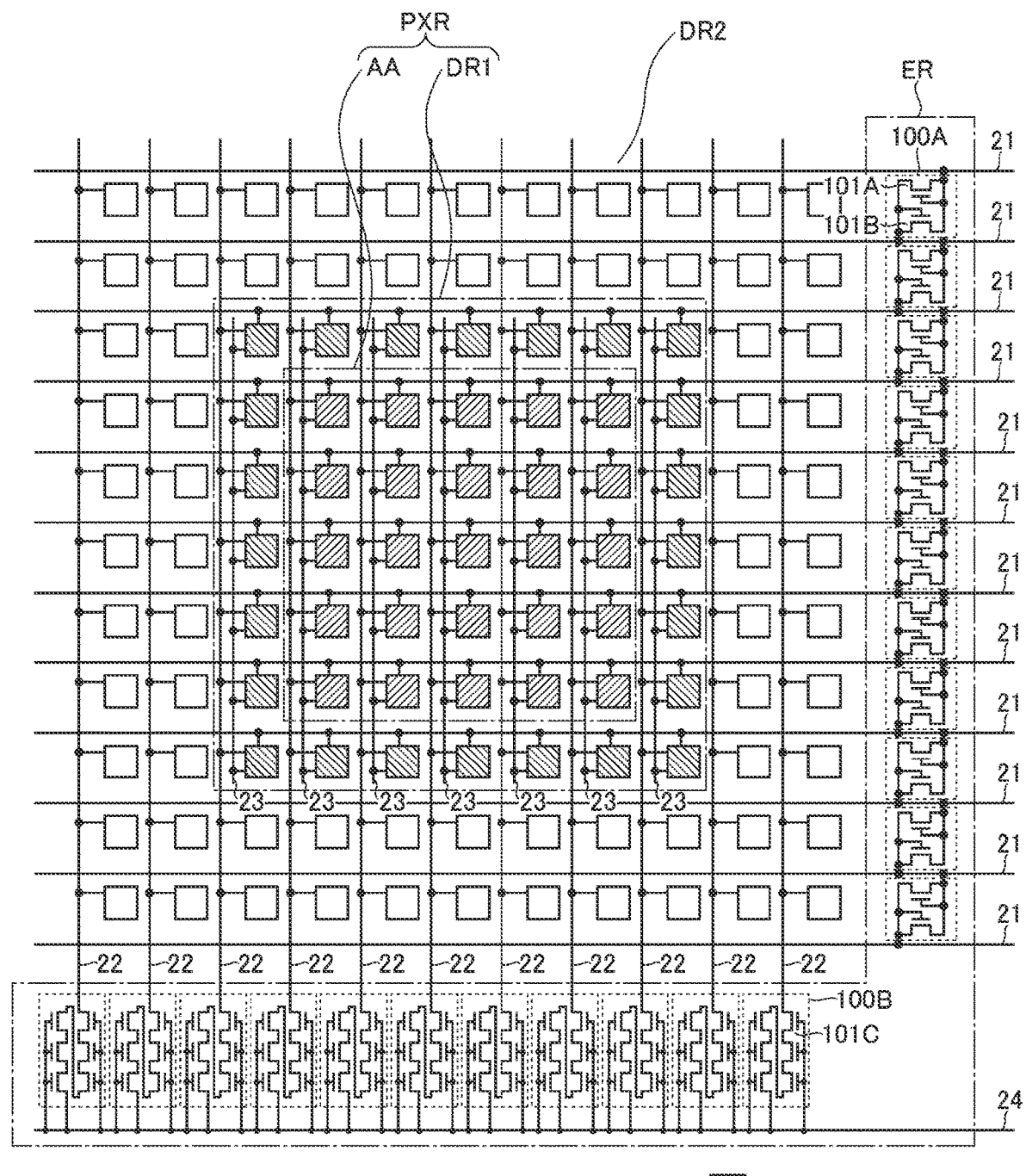
FIG. 7 is a plan view illustrating schematic structures of an active area, a first dummy region, a second dummy region, and a protection region in the photoelectric conversion device according to the third embodiment.

FIG. 7 is a plan view illustrating a schematic structure of a photoelectric conversion device 10 according to this embodiment, and corresponds to FIG. 2B described in the first embodiment. As illustrated in the drawing, according to this example, dummy data wires 22 are also disposed in the second dummy region DR2 in addition to the structure illustrated in FIG. 2B. In other words, the dummy data wires 22 disposed along the Y direction are each connected to the sources of the TFTs 30D of the dummy pixels DPX2 on the same column. Moreover, the data wires 22 in the pixel region PXR are extended not only to the inside of the pixel region PXR but also to the second dummy region DR2, and connected to the sources of the TFTs 30D of the corresponding dummy pixels DPX2. Furthermore, the gate wires 21 that pass inside the pixel region PXR are connected to the gates of the dummy pixels DPX1 in the first dummy region DR1. The photoelectric conversion device 10 has a protection region ER outside the second dummy region DR2. Note that, in FIG. 7, the protection region ER is disposed to be adjacent to only one side of the second dummy region DR2 in the X direction and only one side of the second dummy region DR2 in the Y direction; alternatively, the protection region ER may be arranged to surround the second dummy region DR2.

The protection region ER includes multiple ESD elements 100A and 100B. Each of the ESD elements 100A is disposed between adjacent gate wires 21, and each of the ESD elements 100B is provided in a data wire 22. Each of the ESD elements 100A is equipped with two TFTs 101A and 101B. The TFTs 101A and 101B are connected in parallel. In other words, in a TFT 101A, one of the source and the drain is connected to the gate of the TFT 101A and one of the gate wires 21, and is further connected to one of the source and the drain of the TFT 101B. In addition, in a TFT 101B, the other one of the source and the drain is connected to the gate of the TFT 101B and the other one of the gate wires 21, and is further connected to the other one of the source and the drain of the TFT 101A.

Each of the ESD elements 100B is equipped with six TFTs 101C, for example. These TFTs 101C are connected in series between the data wire 22 and the ground wire 24, and the gates are commonly connected to the ground wire 24. The circuit structures of the ESD elements 100A and 100B are not limited to those illustrated in FIG. 7, and may be any structures that can protect the pixel region PXR from static electricity.

Figure 8:
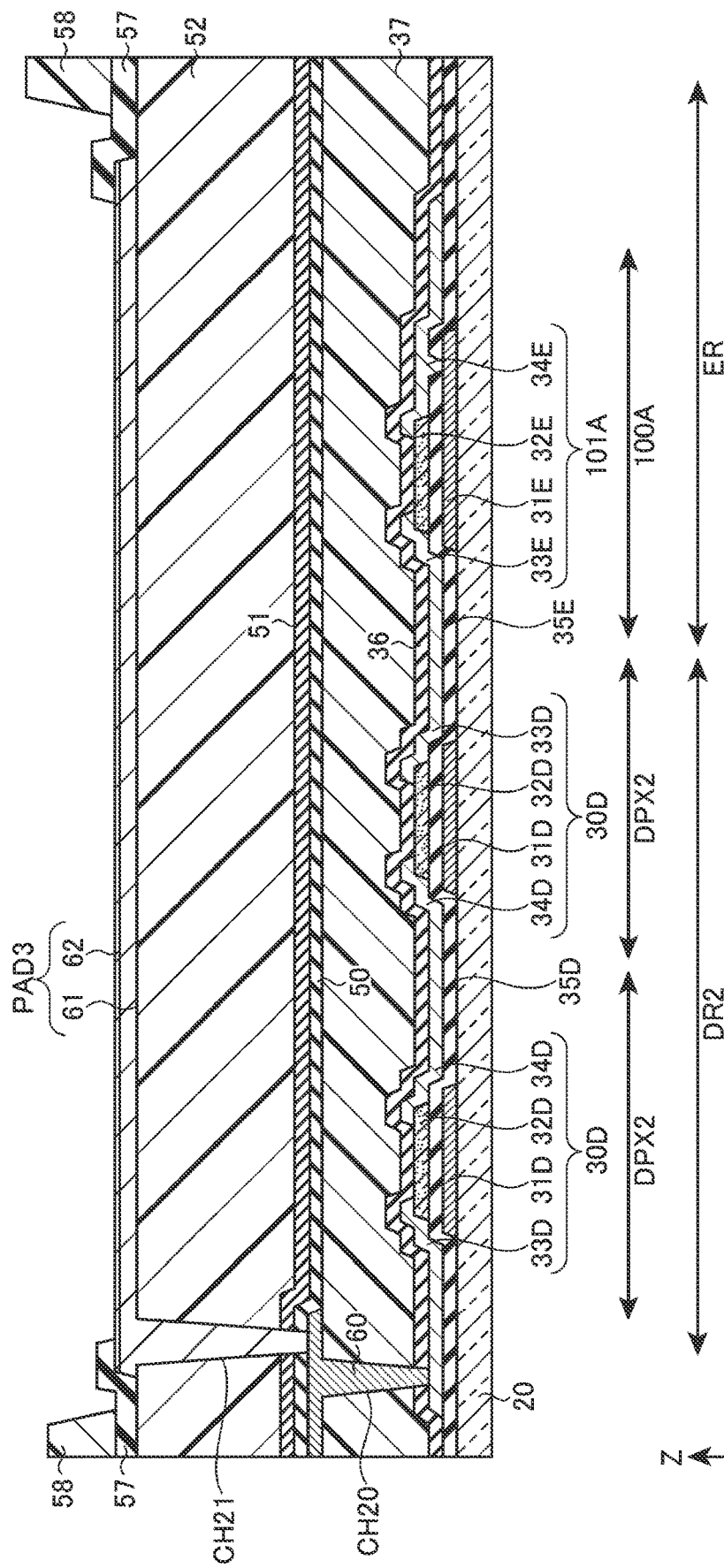
FIG. 8 is a cross-sectional view of the second dummy region and the protection region in the photoelectric conversion device according to the third embodiment.

FIG. 8 is a cross-sectional view of the second dummy region DR2 and the protection region ER, and corresponds to FIG. 4D described in the first embodiment. In FIG. 8, only one TFT 101A is illustrated in the protection region ER, but the TFTs 101B and 101C have the same structure.

As illustrated in the drawing, the TFT 101A includes a gate electrode 31E, a semiconductor layer 32E, a source electrode 33E, and a drain electrode 34E. The gate electrode 31E, the source electrode 33E, and the drain electrode 34E are each a metal film used in forming the TFT 101A, and may be formed at the same level in the same step by using the same material as the gate electrode 31, the source electrode 33, and the drain electrode 34 of the TFT 30, for example.

As with the TFTs 30 and 30D, the TFT 101A has the gate electrode 31E formed on the substrate 20, and the gate insulating film 35E is formed on the gate electrode 31E. The gate insulating film 35E may also be formed at the same level in the same step by using the same material as the gate insulating films 35 and 35E. The source electrode 33E and the drain electrode 34E are formed on the gate insulating film 35E and the semiconductor layer 32E. In addition, in the example illustrated in FIG. 8, the drain electrode 34E is connected to the gate electrode 31E. Then the first insulating film 36 is formed on the semiconductor layer 32E, the source electrode 33E, and the drain electrode 34E. Other features are as illustrated in FIG. 4D described in the first embodiment. Note that, in the example illustrated in FIG. 8, the external connection terminals PAD2 are formed to overlap not only the dummy pixels DPX2 but also the ESD elements 100A in the X direction. Alternatively, the external connection terminals PAD2 may have no overlap portion with the ESD elements 100A. Still alternatively, the external connection terminals PAD2 may be formed to overlap the ESD elements 100A but not the dummy pixels DPX2. In addition, although FIG. 8 illustrates the example in which the contact hole CH20 is formed between the first dummy region DR1 and the second dummy region DR2, the contact hole CH20 may be formed between the second dummy region DR2 and the protection region ER or inside the protection region ER. The same applies to the ESD elements 100B and 100C and the external connection terminals PAD1 and PAD3.

As described above, according to the structures of the present embodiment, the ESD elements 100A and 100B can be formed adjacent to the dummy pixels DPX2 by forming the external connection terminals PAD on the second dummy region DR2 and/or the protection region ER. Thus, the TFTs 101A and 101B can be formed into substantially the same pattern as the TFTs 30 and 30D. In other words, isolation of the TFTs 101A and 101B caused by placing the external connection terminals PAD between the TFTs 30D and the TFTs 101A and 101B is suppressed, and the non-uniformity in the shapes of the TFTs 101A and 101B caused by the micro loading effect can be suppressed. Note that although this embodiment describes an example in which a protection region ER is added to the structure described in the first embodiment, this embodiment is applicable to the second embodiment also.

Modification Examples Etc.

Although the first to third embodiments have been described heretofore, the embodiments are not limited to these.

For example, there are various arrangement examples for the external connection terminals PAD on the second dummy region DR2. Such examples will now be described with reference to FIGS. 9A to 9D. FIGS. 9A to 9D illustrate arrangement examples of the external connection terminals PAD according to modification examples of the aforementioned embodiments. In FIGS. 9A to 9D, for the sake of simplicity, only the second dummy pixels DPX2, the gate wire 21, the data wire 22, and the external connection terminals PAD1 on the XY plane are illustrated.

Figure 9A:
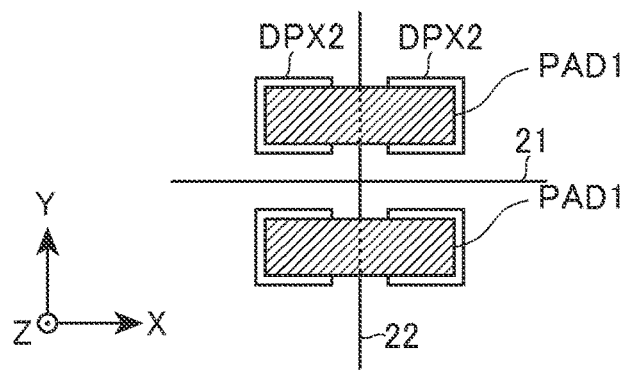
FIG. 9A is a layout diagram of external connection terminals of a photoelectric conversion device according to a first modification example of the first to third embodiments.

First, as illustrated in FIG. 9A, the external connection terminals PAD1 may each be arranged to straddle multiple dummy pixels DPX2 along the X direction. In the example illustrated in FIG. 9A, the external connection terminals PAD1 are each arranged to straddle two dummy pixels DPX2; alternatively, the external connection terminals PAD1 may each be arranged straddle three or more dummy pixels DPX2 or may each be formed on one dummy pixel DPX2. The same applies to FIGS. 9B to 9D. In the example illustrated in FIG. 9A, the width of the external connection terminals PAD1 in the Y direction is equal to or smaller than the width of the dummy pixels DPX2 in the Y direction, and the external connection terminals PAD1 completely overlap the dummy pixels DPX2 in the Y direction. In the example illustrated in FIG. 9B, the positions of the dummy pixels DPX2 and the external connection terminals PAD1 are not in alignment in the Y direction in the example illustrated in FIG. 9A, and some region of the external connection terminals PAD1 are located in a region between adjacent dummy pixels DPX2 in the Y direction. Here, some regions of the external connection terminals PAD1 may overlap the gate wires 21. In the example illustrated in FIG. 9C, the positions of the dummy pixels DPX2 and the external connection terminals PAD1 are completely out of alignment in the Y direction, and the entire regions of the external connection terminals PAD1 are located in a region between adjacent dummy pixels DPX2 in the Y direction. That is, in the example illustrated in FIG. 9C, the dummy pixels DPX2 and the external connection terminals PAD1 do not overlap one another in the Z direction. In such a case, the external connection terminals PAD1 may overlap the gate wires 21.

Figure 9B:
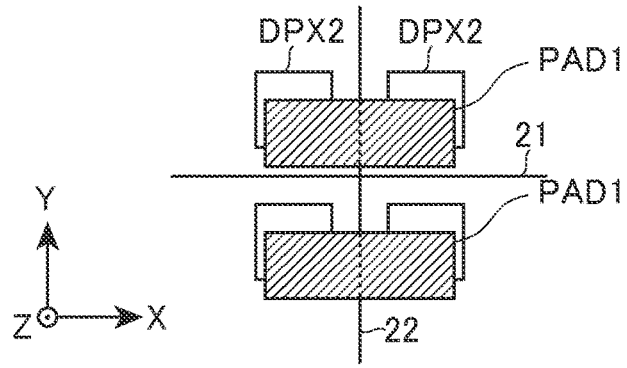
FIG. 9B is a layout diagram of external connection terminals of a photoelectric conversion device according to a second modification example of the first to third embodiments.
Figure 9C:
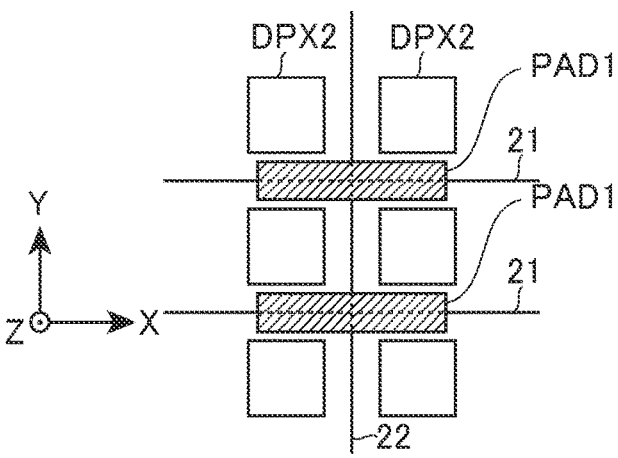
FIG. 9C is a layout diagram of external connection terminals of a photoelectric conversion device according to a third modification example of the first to third embodiments.
Figure 9D:
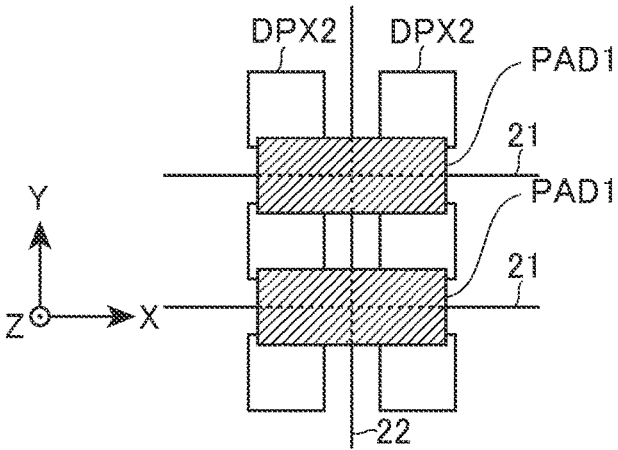
FIG. 9D is a layout diagram of external connection terminals of a photoelectric conversion device according to a fourth modification example of the first to third embodiments.

Furthermore, in the example illustrated in FIG. 9D, the external connection terminals PAD1 may each straddle adjacent two dummy pixels DPX2 in the Y direction in the example illustrated in FIG. 9B. In such a case, the external connection terminals PAD1 each overlap not only the two dummy pixels DPX2 but also the gate wires 21. The examples described above equally apply to the external connection terminals PAD2 and PAD3 by replacing the X direction by the Y direction, the Y direction by the X direction, and the gate wires 21 by the data wires 22 or bias wires 23 in the descriptions. Note that a dummy pixel DPX2 can be defined as a rectangular region formed by two adjacent gate wires 21 and two adjacent data wires 22 illustrated in FIG. 4C, and the external connection terminals PAD do not have to overlap the TFTs 30D as long as they overlap this rectangular region. Naturally, the external connection terminals PAD1, PAD2, and PAD3 may be formed in the second dummy region DR2 and/or the protection region ER as mentioned above, and the aforementioned arrangement methods can be applied even when these terminals are disposed in the protection region ER.

In the embodiments described above, examples of using the photoelectric conversion device 10 in the X-ray imaging device 1 are described. However, the photoelectric conversion device 10 may be used in other products such as image sensors. Furthermore, a member having an optical function, such as a color filter, may be disposed on the photoelectric conversion device 10 in addition to the scintillator 3.

In the embodiments described above, examples of forming an image by the photoelectric conversion device 10 on the basis of the scintillation light are described. Alternatively, the photoelectric conversion device 10 of the present invention is also applicable to the cases where images are formed by other light such as visible light.

Furthermore, in the embodiments described above, the case where the photoelectric conversion layer 45 of the photoelectric conversion element 40 includes an n-type semiconductor layer 45A1, an i-type semiconductor layer 45A2, and a p-type semiconductor layer 45A3 that are stacked in sequence from the substrate 20 side is described. Alternatively, the photoelectric conversion layer 45 may include a p-type semiconductor layer 45A3, an i-type semiconductor layer 45A2, and an n-type semiconductor layer 45A1 stacked in sequence from the substrate 20 side. In other words, the structure may be any as long as the i-type semiconductor layer 45A2 is located between the n-type semiconductor layer 45A1 and the p-type semiconductor layer 45A3.

Furthermore, the photoelectric conversion layer 45 of the aforementioned embodiments includes an n-type semiconductor layer 45A1 that contains n-type amorphous silicon, an i-type semiconductor layer 45A2 that contains i-type amorphous silicon, and a p-type semiconductor layer 45A3 that contains p-type amorphous silicon that are stacked. However, the photoelectric conversion layer 45 is not limited to this. The photoelectric conversion layer 45 of this embodiment may be formed of, for example, an organic semiconductor material.

In the embodiments described above, examples in which the protection layers such as the first insulating film 36, the third insulating film 50, the fourth insulating film 51, and the sixth insulating film 57 are inorganic insulating films containing silicon oxide ($SiO_x$) are described. However, the structure of the protection layers of the present invention is not limited to this. The protection layer may include, instead of an inorganic insulating film containing silicon nitride ($SiN_x$), an inorganic insulating film that contains, for example, silicon oxide ($SiO_x$), silicon oxynitride ($SiO_xN_y$) (x>y), silicon oxynitride ($SiN_xO_y$) (x>y), or aluminum oxide ($Al_xO_y$).

Alternatively, the protection layer may include, instead of the aforementioned inorganic insulating film, a layer formed of, for example, titanium oxide (TiO), titanium nitride (TiN), titanium (Ti), niobium molybdenum oxide (MoNbO), niobium molybdenum nitride (MoNbN), molybdenum niobium (MoNb), tungsten (W), or tantalum (Ta). A layer formed of a transparent conductive film, such as In—Zn—O or In—Ga—Zn—O may also be included.

Furthermore, individual elements that are described in the embodiments and modification examples described above may be combined as appropriate as long as there is no inconsistency.

The present invention is not limited to the description of the embodiments above and may be altered within the scope of the claims. Embodiments based on a proper combination of technical means disclosed in different embodiments are encompassed in the technical scope of the present invention. Furthermore, a new technological feature can be created by combining different technological means disclosed in the embodiments.

What is claimed is:

1. A photoelectric conversion device comprising:
    a first transistor disposed on a first region of a substrate;
    a first photoelectric conversion element that is disposed on the first region of the substrate and is electrically connected to the first transistor;
    a second transistor disposed on a second region of the substrate, wherein the second transistor is a dummy transistor of the first transistor;
    an insulating layer that is disposed on the substrate and covers the first transistor, the first photoelectric conversion element, and the second transistor; and
    a first terminal that is disposed on the insulating layer, is electrically connected to one of the first transistor and the first photoelectric conversion element, and is connectable to an outside.

2. The photoelectric conversion device according to claim 1, wherein the first terminal is disposed on the insulating layer in the second region.

3. The photoelectric conversion device according to claim 1, wherein the first terminal overlaps the second transistor in a plan view.

4. The photoelectric conversion device according to claim 1, wherein the first terminal is electrically connected to a gate of the first transistor, and a gate of the second transistor is electrically floating.

5. The photoelectric conversion device according to claim 1, wherein the first terminal is electrically connected to a source or a drain of the first transistor.

6. The photoelectric conversion device according to claim 1, wherein the second region surrounds the first region.

7. The photoelectric conversion device according to claim 6, further comprising:
    a third transistor that is disposed on a third region of the substrate, and
    a second photoelectric conversion element electrically connected to the third transistor,
    wherein the third transistor is a dummy transistor of the first transistor,
    the second photoelectric conversion element is a dummy element of the first photoelectric conversion element,
    a gate of the third transistor is not electrically connected to the first terminal, and the third region surrounds the first region and is between the first region and the second region.

8. The photoelectric conversion device according to claim 7,
wherein the first region is an active region that generates charges according to incident light and outputs a voltage corresponding to the charges to outside, and
the second region and the third region are dummy regions of the active region.

9. An X-ray imaging device comprising:
the photoelectric conversion device recited in claim 7; and
a scintillator that converts incident X-ray into scintillation light, the scintillator being disposed on the photoelectric conversion device,
wherein a signal generated by the second photoelectric conversion element is not output to outside.

10. The photoelectric conversion device according to claim 1,
wherein the insulating layer includes a first insulating layer disposed on the substrate, and a second insulating layer disposed on the first insulating layer, and
the first terminal is disposed on the second insulating layer.

11. The photoelectric conversion device according to claim 1, further comprising:
an ESD (electro-static discharge) element disposed on a third region of the substrate,
wherein the third region is adjacent to the second region.

12. The photoelectric conversion device according to claim 1, wherein the first photoelectric conversion element includes an n-type semiconductor layer, a p-type semiconductor layer, and an i-type semiconductor layer disposed between the n-type semiconductor layer and the p-type semiconductor layer.

13. The photoelectric conversion device according to claim 12, wherein the n-type semiconductor layer is disposed on the i-type semiconductor layer, and the i-type semiconductor layer is disposed on the p-type semiconductor layer.

14. The photoelectric conversion device according to claim 12, wherein the p-type semiconductor layer is disposed on the i-type semiconductor layer, and the i-type semiconductor layer is disposed on the n-type semiconductor layer.

15. The photoelectric conversion device according to claim 12, wherein the first transistor is an oxide semiconductor TFT (thin film transistor) that includes an oxide semiconductor layer and a gate electrode disposed on the oxide semiconductor layer with a gate insulating film interposed therebetween.

16. The photoelectric conversion device according to claim 15, wherein the oxide semiconductor layer contains an In—Ga—Zn—O semiconductor.

17. An X-ray imaging device comprising:
the photoelectric conversion device recited in claim 1; and
a scintillator that converts incident X-ray into scintillation light, the scintillator being disposed on the photoelectric conversion device.

18. The X-ray imaging device according to claim 17, wherein the scintillation light is converted into charges in the first region, and a voltage corresponding to the charges is output to outside through the first terminal.

19. The X-ray imaging device according to claim 18, wherein:
the second region include no photoelectric conversion element, and
the scintillation light obtained in the scintillator and incident on the second region is not converted into charges.

* * * * *